(12) United States Patent
Schmitt et al.

(10) Patent No.: US 9,510,485 B2
(45) Date of Patent: Nov. 29, 2016

(54) EXPANDABLE, MODULAR INFORMATION TECHNOLOGY FACILITY WITH MODULARLY EXPANDABLE COOLING

(71) Applicant: DELL PRODUCTS, L.P., Round Rock, TX (US)

(72) Inventors: Ty Schmitt, Round Rock, TX (US); Mark Bailey, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 19 days.

(21) Appl. No.: 14/590,156

(22) Filed: Jan. 6, 2015

(65) Prior Publication Data

US 2016/0198592 A1    Jul. 7, 2016

(51) Int. Cl.
  *H05K 7/20* (2006.01)
  *G06F 1/20* (2006.01)
  *H05K 1/14* (2006.01)

(52) U.S. Cl.
  CPC ................ *H05K 7/20745* (2013.01)

(58) Field of Classification Search
  CPC .... H05K 7/20; H05K 5/0213; H05K 7/1488; H05K 7/20745; H05K 13/00; H05K 5/02; H05K 7/20827; G06F 1/20; H01L 23/36; E04H 5/00; E04H 1/00; E04L 1/66
  USPC ........... 361/679.31, 679.46–679.5, 688, 689, 361/690–695, 698, 699, 700–715, 361/720–727; 165/80.2, 80.4, 104.33, 165/121–126; 52/79.1, 79.8, 64, 243.1, 52/173.1, 741.1, 745.02, 234; 457/184, 457/187; 700/297–300
  See application file for complete search history.

(56) References Cited

U.S. PATENT DOCUMENTS

| | | | |
|---|---|---|---|
| 5,747,734 A | 5/1998 | Kozlowski et al. | |
| 6,983,567 B2 | 1/2006 | Ciotti | |
| 7,278,273 B1 * | 10/2007 | Whitted | H05K 7/1497 361/690 |
| 7,644,051 B1 | 1/2010 | Moore et al. | |

(Continued)

FOREIGN PATENT DOCUMENTS

WO    WO2013/076463 A1 *    5/2013

OTHER PUBLICATIONS

Ihezie, Joshua K., Final Office Action, U.S. Appl. No. 14/590,186, The United States Patent and Trademark Office, Feb. 23, 2016.

(Continued)

*Primary Examiner* — Michail V Datskovskiy
(74) *Attorney, Agent, or Firm* — Isidore PLLC

(57) ABSTRACT

An Expandable Modular Information Technology (EMIT) Facility (EMITF) includes: an EMIT Building Infrastructure (EMITBI) having an initial enclosure that includes: a base pad providing a fixed usable space area on which one or more modular IT components are placed; and a plurality of exterior walls, including at least one removable expansion wall (REW) that enables expansion of the usable space area of the EMITBI; a plurality of modular IT components placed within the EMITBI on the usable space, and which dissipate heat; and at least one air handling unit (AHU) in fluid communication with the enclosure to support cooling of one or more of the IT components within the enclosure. As the EMITBI is expanded to include more IT components, additional AHUs are added to the EMITF in fluid communication with a respective area of the EMITBI to provide cooling to the added IT components.

9 Claims, 30 Drawing Sheets

(56) References Cited

U.S. PATENT DOCUMENTS

| | | | |
|---|---|---|---|
| 7,712,813 B2 | 5/2010 | Franco | |
| 7,738,251 B2* | 6/2010 | Clidaras | G06F 1/20 |
| | | | 165/80.4 |
| 8,251,785 B2 | 8/2012 | Schmitt et al. | |
| 8,514,572 B2* | 8/2013 | Rogers | H05K 7/20745 |
| | | | 165/287 |
| 8,833,001 B2* | 9/2014 | Gardner | E04B 1/34384 |
| | | | 52/243.1 |
| 8,943,757 B2* | 2/2015 | Parizeau | E04H 1/005 |
| | | | 361/694 |
| 9,101,080 B2* | 8/2015 | Czamara | H05K 7/1497 |
| 9,237,681 B2* | 1/2016 | Slessman | H05K 7/20745 |
| 9,238,681 B2 | 1/2016 | Inouye et al. | |
| 2006/0059792 A1 | 3/2006 | Tiramani | |
| 2007/0213000 A1 | 9/2007 | Day | |
| 2009/0107652 A1 | 4/2009 | VanGilder et al. | |
| 2009/0168345 A1 | 7/2009 | Martini | |
| 2009/0229194 A1 | 9/2009 | Armillas | |
| 2010/0043309 A1 | 2/2010 | Martin et al. | |
| 2010/0136895 A1 | 6/2010 | Sgro | |
| 2010/0144265 A1* | 6/2010 | Bednarcik | H05K 7/20745 |
| | | | 454/184 |
| 2010/0170277 A1 | 7/2010 | Schmitt et al. | |
| 2010/0223858 A1 | 9/2010 | Billings | |
| 2010/0251629 A1 | 10/2010 | Clidaras et al. | |
| 2010/0290197 A1 | 11/2010 | Bergthold et al. | |
| 2011/0023388 A1* | 2/2011 | Tong | E04H 5/02 |
| | | | 52/173.1 |
| 2011/0099918 A1 | 5/2011 | Buchmann | |
| 2012/0255710 A1 | 10/2012 | Maselli et al. | |
| 2013/0199032 A1* | 8/2013 | Czamara | H05K 7/1497 |
| | | | 29/825 |
| 2013/0232888 A1* | 9/2013 | Crosby, Jr. | E04H 1/00 |
| | | | 52/79.8 |
| 2013/0305626 A1 | 11/2013 | Strickland et al. | |
| 2014/0059945 A1* | 3/2014 | Gardner | H05K 7/1497 |
| | | | 52/64 |
| 2014/0059946 A1* | 3/2014 | Gardner | E04B 1/34384 |
| | | | 52/64 |
| 2014/0190191 A1* | 7/2014 | Slessman | H05K 7/20836 |
| | | | 62/91 |
| 2014/0352231 A1* | 12/2014 | Crosby, Jr. | H05K 7/1497 |
| | | | 52/79.8 |

OTHER PUBLICATIONS

Ihezie, Joshua K., Advisory Action, U.S. Appl. No. 14/590,186, The United States Patent and Trademark office, Jun. 15, 2016.

Datskovskiy, Michail V., Non-Final Office Action, U.S. Appl. No. 14/590,205, The United States Patent and Trademark Office.

Ihezie, Joshua K., Non-Final Office Action, U.S. Appl. No. 14/590,186, The United States Patent and Trademark Office, Sep. 11, 2015.

Agudelo, Paola, Non-Final Office Action, U.S. Appl. No. 14/590,205, The United States Patent and Trademark Office, Mar. 2, 2016.

* cited by examiner

Multipurpose Module 1

Foam Panel (Outside Walls)

Multipurpose Module 2

EXPANDABLE, MODULAR INFORMATION TECHNOLOGY FACILITY WITH MODULARLY EXPANDABLE COOLING

RELATED APPLICATION/S

The present application is related to the following commonly owned and assigned, co-pending applications, which are both filed on concurrent date herewith:

U.S. application Ser. No. 14/590,186, titled "EXPANDABLE, MODULAR INFORMATION TECHNOLOGY BUILDING INFRASTRUCTURE WITH REMOVABLE EXTERIOR EXPANSION WALL;" and U.S. application Ser. No. 14/590,205 titled "EXPANDABLE, MODULAR INFORMATION TECHNOLOGY FACILITY PROVIDING EFFICIENT EXPANSION OF DISTRIBUTED POWER SUPPLY SYSTEM."

BACKGROUND

1. Technical Field

The present disclosure generally relates to cooling of a large scale information handling systems and in particular to cooling of a modularly-constructed and expandable infrastructure housing large scale information handling systems. Still more particularly, the present disclosure relates to enabling modular scaling of cooling and/or heat exchange facilities within an expandable, modular information technology facility (EMITF).

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Large scale information handling systems exists as server farms that are typically housed in a pre-built physical structure designed to host a pre-set number of racks and associated cooling and power systems. A modular data center, for example, typically includes (i) a known physical dimension that allows for a specific maximum number of server racks and (ii) associated pre-constructed and/or in-built cooling mechanisms and (iii) a pre-configured maximum available power supply to maintain the operational viability of the IT gear being operated within the data center. When additional processing capacity is required or desired by a customer, a new data center is constructed, often at another location, with a new building or structure required to house an independent set of server racks, IT gear, and cooling and power systems. Each such data center is constructed at substantial cost that does not scale with or directly correlate to the amount of additional processing or storage capacity desired by the end customer, as the entire new physical facility has to be constructed or purchase and then remotely connected (e.g., via a network) to the previous facility.

BRIEF SUMMARY

Modularly Expandable Cooling for an EMITF

Disclosed are an Expandable Modular Information Technology (EMIT) Facility (EMITF) that includes an EMIT Building Infrastructure (EMITBI) enclosing a large-scale, modularly-assembled information handling system (LMIHS) that is cooled using modular cooling units that can be modularly expanded to accommodate expansion of the LMIHS and/or the EMITBI. The EMITBI includes: a plurality of exterior walls extending vertically upwards and connected to a roof structure to provide an initial outer enclosure of the EMITBI, within which a first maximum number of modular components with IT gear can be housed. At least one of the plurality of exterior walls is constructed as a removable expansion wall (REW) that enables later expansion of the EMITBI to occur without affecting the continuing operation of existing IT gear within the initial enclosed segment of the EMITBI.

According to a more specific aspect of the present disclosure, the EMITF includes at least one air handling unit (AHU), each in fluid communication with the EMITBI via a corresponding AHU bay located within one of the other fixed exterior walls. The AHU provides cooling of the IT gear located within one or more modular components placed in a section of the EMITBI that is adjacent to the location of the AHU. Each AHU is positioned adjacent to and connected with a corresponding AHU bay located in one or more of the side walls of the EMITBI. In one embodiment, a first set of at least one AHU is in fluid communication with an initial base section of an expanded EMITBI and provides cooling to the initial IT gear located within the initial base section of the expanded EMITBI. A second set of at least one AHU is then provided in fluid communication with an expanded section of the expanded EMITBI and provides required cooling to additional IT gear that is later located within the expanded section of the expanded EMITBI. According to one aspect, the first set and second set of AHUs can be connected to a system-level cooling controller that can separately control an amount of cooling provided by each AHU to cool the corresponding sections of the expanded EMITBI, independent of the amount of cooling provided by other AHUs to cool other sections of the expanded EMITBI.

In at least one embodiment, the AHUs are located on top of the EMITBI to reduce a footprint of the EMITF relative to usable ground space. This enables future expansion of the EMITBI without having the restriction of adjacent side space for the AHUs that are required to be added during such expansions. Regardless of the location of the AHU relative to the EMITBI, the system cooling can be modularly expanded by simply adding a new AHU as needed to support expansion of the EMITBI and/or modular components having additional IT gear.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1A:
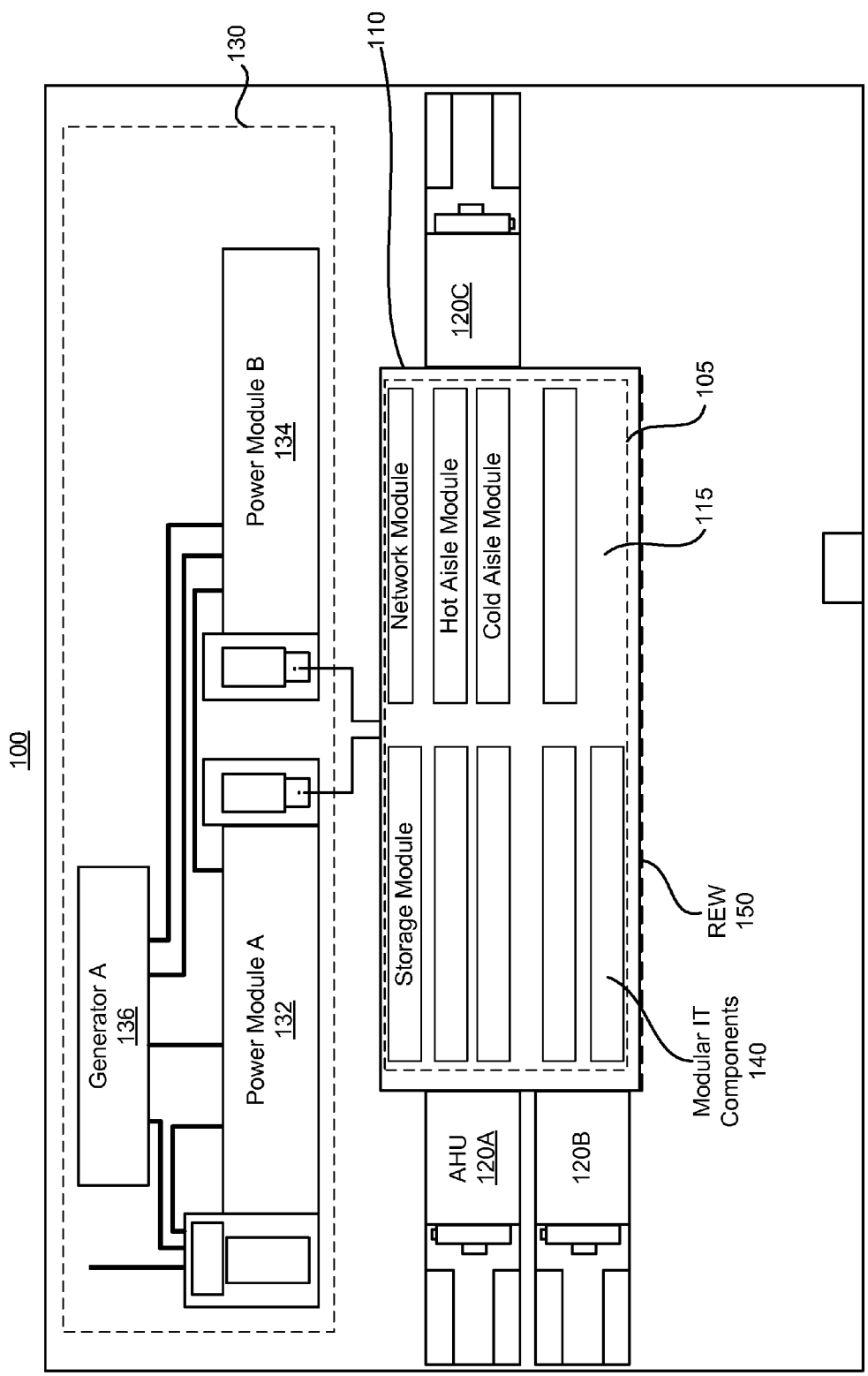
FIG. 1A is a block diagram representation of an example Expandable Modular Information Technology (EMIT) Facility (EMITF) providing an EMIT building infrastructure (EMITBI) for housing modular information technology (IT) components, according to one embodiment.

The illustrative embodiments provide are an Expandable Modular Information Technology (EMIT) Building Infrastructure (EMITBI) that supports a large-scale, modularly-assembled information handling system (LMIHS) and a method for modularly expanding a structure of an EMIT facility (EMITF) and IT capabilities of the LMIHS being hosted therein. The EMITBI includes: a base pad providing a fixed area of usable space on which one or more modular sub-components of the LMIHS can be placed; and a plurality of exterior walls extending vertically from an outer perimeter of the base pad and connected to a roof structure. The plurality of exterior walls and roof structure collectively provide an initial outer enclosure of the EMITBI, within which a first maximum number of modular components with IT gear can be housed. The plurality of exterior walls includes at least one exterior wall that is constructed as a removable expansion wall (REW) that enables later expansion of the EMITBI to occur. In one embodiment, the REW has a plurality of structural connecting mechanisms that allow for later de-assembly and removal of the REW without affecting a structural integrity of a remainder of the EMITBI. The REW remains physically in place to shield the IT modules located within the first section of the EMITBI during construction of an adjoining expansion section. The EMITBI provides an enclosure that protects the IT gear located therein, and the REW enables future expansion of the EMITBI, where the expansion occurs without affecting the continuing operation of existing IT gear within the initial enclosed segment of the EMITBI.

According to one aspect, the EMITF includes modular cooling units (MCUs) and the large-scale, modularly-assembled information handling system (LMIHS) is cooled using MCUs that can be modularly expanded to accommodate expansion of the LMIHS and/or the EMITBI. Specifically, the EMITF includes at least one air handling unit (AHU), each in fluid communication with the EMITBI via a corresponding AHU bay located within one of the other fixed exterior walls. The AHU provides cooling of the IT gear located within one or more modular components placed in a section of the EMITBI that is adjacent to the location of the AHU. Each AHU is positioned adjacent to and connected with a corresponding AHU bay located in one or more of the side walls of the EMITBI. In one embodiment, a first set of at least one AHU is in fluid communication with an initial base section of an expanded EMITBI and provides cooling to the initial IT gear located within the initial base section of the expanded EMITBI. A second set of at least one AHU is then provided in fluid communication with an expanded section of the expanded EMITBI and provides required cooling to additional IT gear that is later located within the expanded section of the expanded EMITBI. According to one aspect, the first set and second set of AHUs can be connected to a system-level cooling controller that can separately control an amount of cooling provided by each AHU to cool the corresponding sections of the expanded EMITBI, independent of the amount of cooling provided by other AHUs to cool other sections of the expanded EMITBI.

According to another aspect, the EMITF is design with a modularly expandable power supply and distribution (PSD) system that provides power capacity on demand, while maintaining resiliency. The base PSD system is designed to provide stepped power capacity increases while maintaining resiliency on operation of the installed rack IT gear. The base PSD system includes the required breaker/s and distribution components on initial configuration of the system to enable the PSD system to quickly expand the power capacity using the exiting power distribution facilities to distribute the additional power plugged into the PSD system, as the power requirements of the IT components increase. The PSD system is configured for seamless integration of on-demand power generation to accommodate expansion of the LMIHS. At least one of the plurality of exterior walls of the EMITBI is constructed as a removable expansion wall (REW) that enables later expansion of the EMITBI and, by extension, an increase in the number of IT gear provided within the EMITBI necessitating an increase in the amount of power provided by the PSD system to support the expanded LMIHS. When additional power is required, an additional generator is connected directly to a back end of the PSD system, and the pre-configuration of the PSD system allows the additional power being generated to be directed integrated into the existing power distribution system. In one embodiment, firmware running on the controller (along with down-level power usage monitoring devices) monitors the power usage and generates a notification to indicate when more power is required for the overall system, requiring an upgrade of the UPS.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not for other embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural or functional or otherwise) on the described embodiments.

Those of ordinary skill in the art will appreciate that the hardware components and basic configuration depicted in any of the figures illustrated by the drawings and described herein may vary. For example, the illustrative components within the described EMITF 100, EMITBI 110, and LMIHS 150, are not intended to be exhaustive, but rather be representative of and highlight components that can be provided by one or more aspects of the present disclosure. For example, other devices/components/modules may be used in addition to or in place of the hardware depicted. The depicted examples do not convey or imply any architectural or other limitations with respect to the presently described embodiments and/or the general disclosure.

Figure 1B:
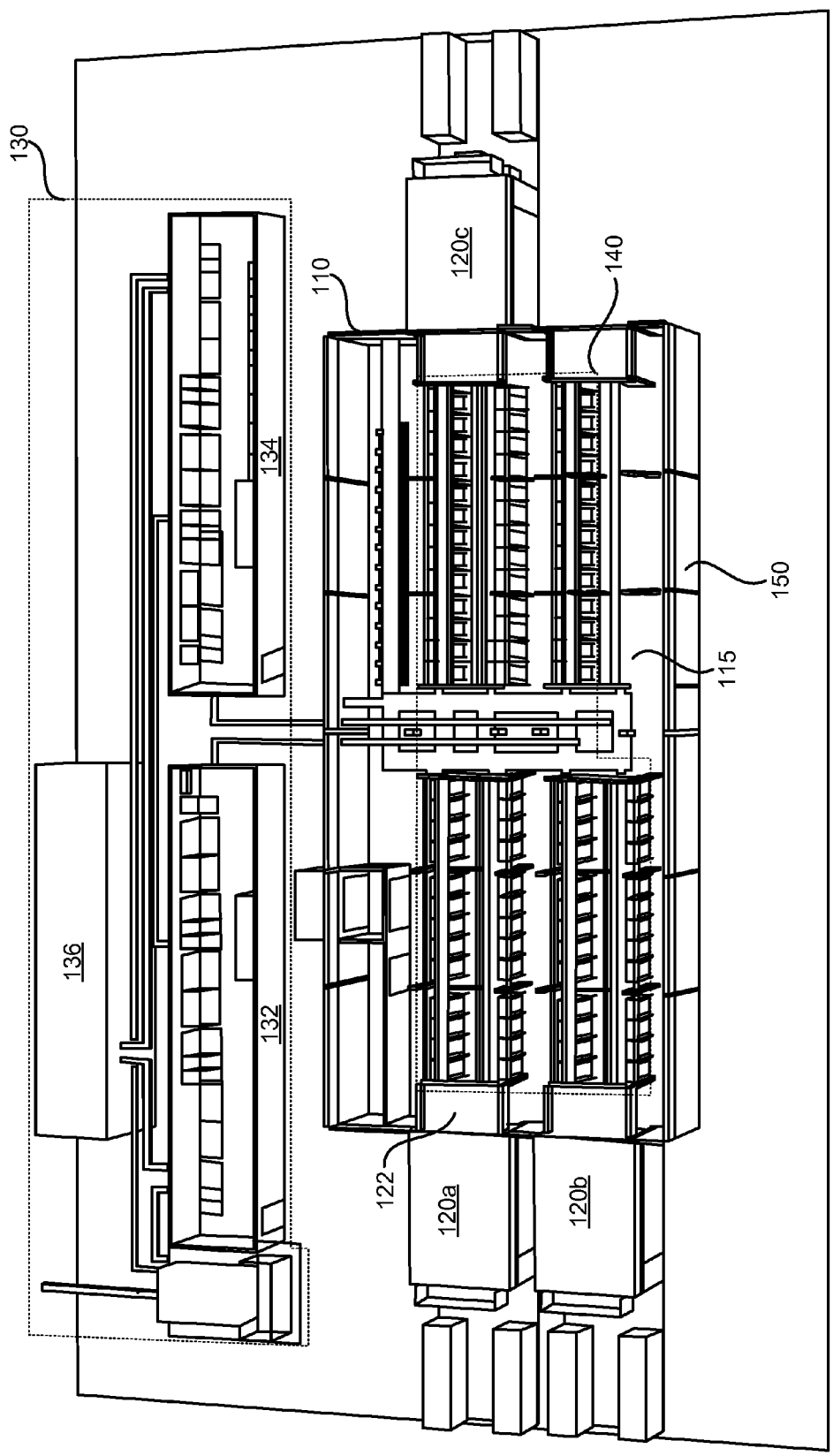
FIGS. 1B-1C provide two different orientations of a three dimensional view of the example EMITF illustrating the positioning of different modular IT components within the EMITBI and corresponding positioning of air handling units (AHUs) and power components, according to one or more embodiments.
Figure 1C:
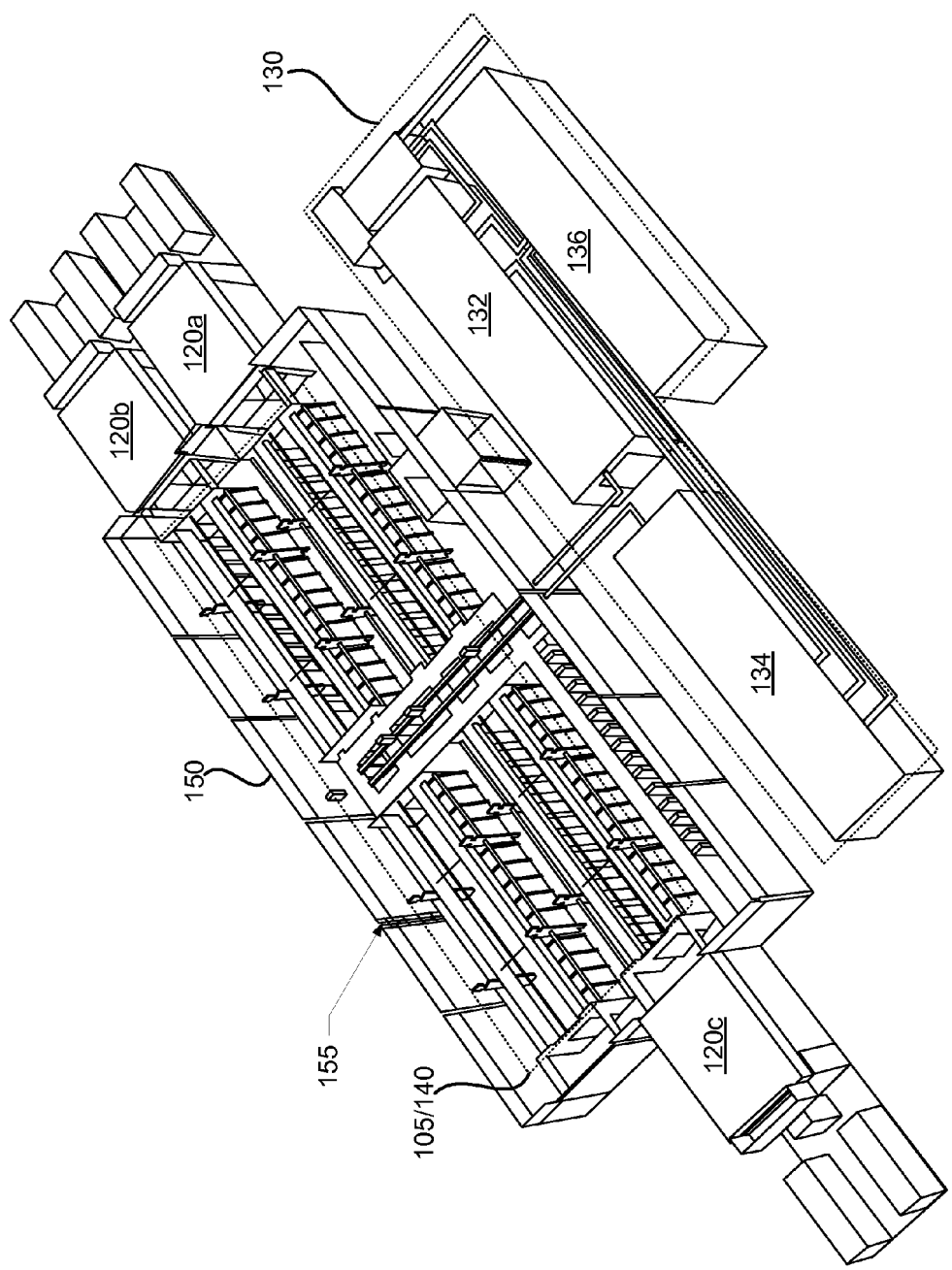
Figure 2:
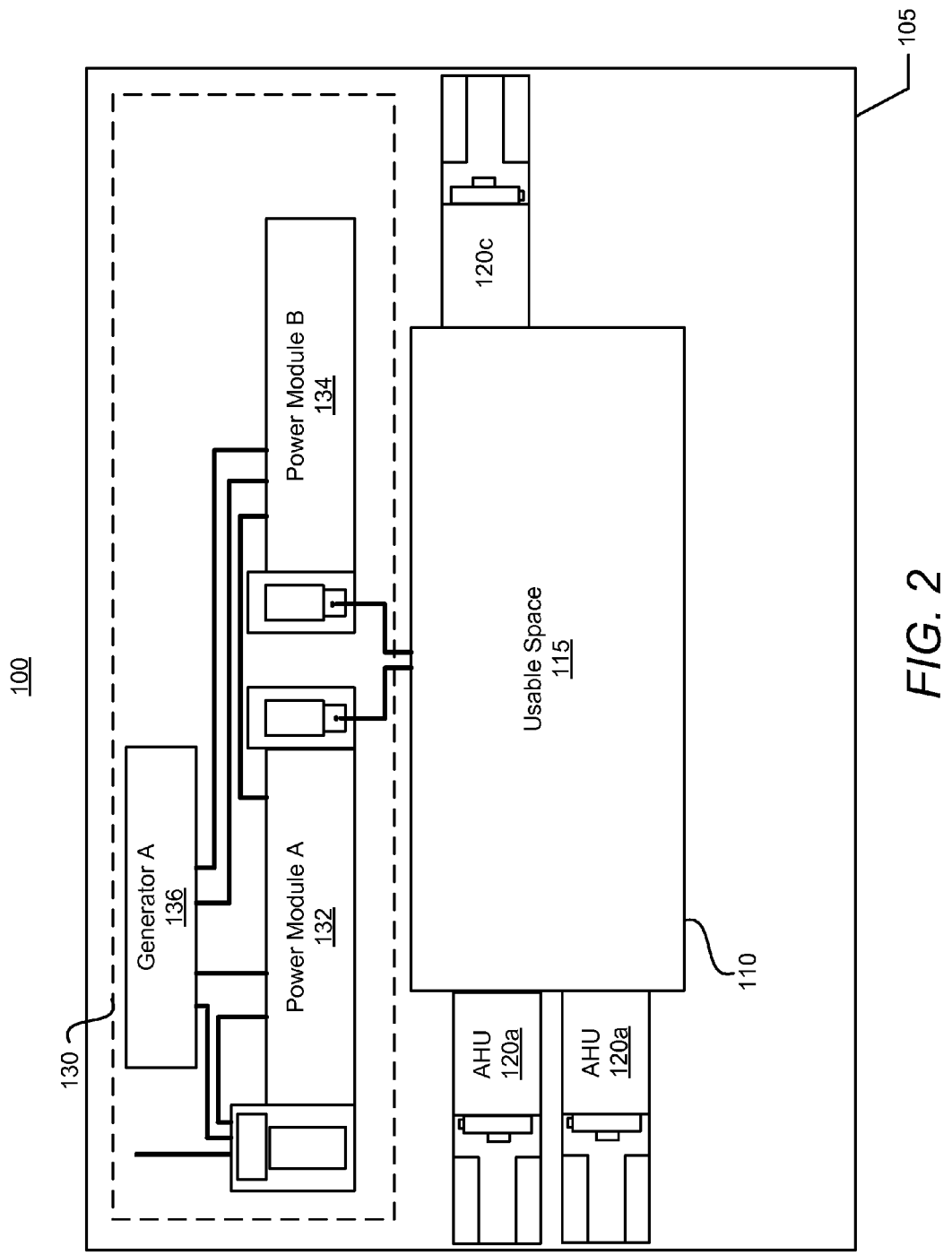
FIG. 2 is a block diagram representation of an initial usable space within a base layout of the EMITBI, according to one embodiment.
Figure 3:
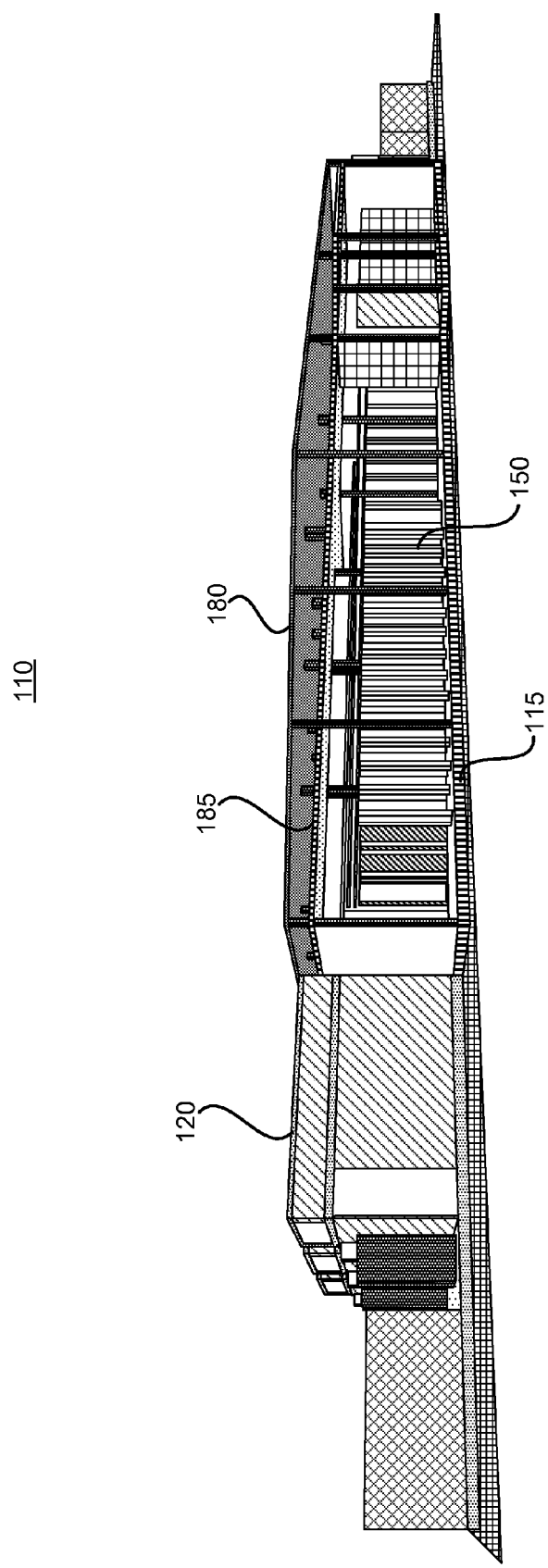
FIG. 3 is a cross-sectional schematic of the example EMITBI illustrating a vertical arrangement of side walls, ceiling and roof structure enclosing modular IT components place on/within the usable space, according to one or more embodiments.

For simplicity and cohesiveness in describing the illustrative embodiments, several of the figures are described together to allow for a more complete description of the functional make-up of the EMITF 100 and the EMITBI 110. FIGS. 1-3 are included in an initial grouping of the figure descriptions. Within this grouping of figures, FIG. 1A is a block diagram representation of an example Expandable Modular Information Technology (EMIT) Facility (EMITF) providing an EMIT building infrastructure (EMITBI) for housing modular information technology (IT) components of a large-scale modularly-constructed information handling system (LMIHS), according to one embodiment. FIGS. 1B-1C provide two different orientations of a three dimensional view of the example EMITF 100 illustrating the positioning of the different modular IT components within the EMITBI 110 and corresponding positioning of air handling units (AHUs) and power components, according to one or more embodiments. In the illustrations of the majority of the figures depicting the different embodiments of the EMITBI 110, the roof structure and ceiling of the EMITBI structures are not shown (i.e., have been illustratively removed) such that the internal structural modules and their relative placement on a base pad or usable space of the EMITBI can be visually ascertained, particularly as the EMITBI is expanded from an initial base EMITBI to an expanded EMITBI.

As introduced above, FIG. 1A presents a block diagram representation and FIGS. 1B-1C illustrate two three-dimensional representations of an example EMITF 100 having an EMITBI 110 that houses a LMIHS 105, according to one or more embodiments. It is appreciated that the LMIHS 105 is a collection of modular components containing functional IT gear, which may include one and likely a plurality of server racks, stacked with compute components, storage devices, connectivity and network cabling, and the like. As further introduced and described herein, the EMITF 100 includes one of more air handling units (AHUs) 120 and a power supply and distribution (PSD) system 130. The PSD system 130 includes one or more power supplies and distribution lines that power the individual IT gear of the LMIHS 105 as well as the AHUs 120. FIGS. 1A-1C illustrate the positional alignment of the different structural modules within the EMITBI 110 (collectively providing the LMIHS 105) and corresponding positioning of associated air handling units (AHUs) 120 and supply units and distribution lines of the PSD system 130, according to one or more embodiments.

While specifically described herein to a large scale information handling system, for purposes of this disclosure, an information handling system, such as LMIHS 105 (FIG. 1), may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. In a general sense an information handling system may be a handheld device, personal computer, a server, a network storage device, or any other suitable device and may vary in size, shape, performance, functionality, and price. It is however appreciated that the information handling systems of the present disclosure are primarily rack-based server systems and that the scale at which these systems are deployed leads to the references herein of a LMIHS. Generally, an information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components. In one or more embodiments, the IT gear that are the functional information handling systems are housed within a cold aisle module of the EMITBI 110.

FIG. 2 is a block diagram representation of the EMITF 100 with an initial usable space within a baseline (i.e., original configuration of) EMITBI 110, according to one embodiment. FIG. 3 is a cross-sectional schematic of the example EMITBI 110 illustrating a vertical arrangement of side walls, ceiling and roof structure enclosing structural modular components placed on/within the usable space, according to one or more embodiments.

As illustrated within one of more of FIGS. 1, 2, and 3, EMITF 100 includes an initial installation of an example EMITBI 110 with a plurality of structural modules (or modular components), as well as one or more AHUs 120 and a PSD system 130. As shown by FIG. 2, baseline EMITBI 110 includes an initial area of modular usable space 115 providing a pad/surface/floor on which one or more modular IT components 140 of a LMIHS can be placed. The modular IT components 140 can include modules for holding one or more information technology (IT) racks of IHSes and other functional components. EMITBI 110 has a plurality of exterior walls extending vertically from the perimeter of the pad/surface/floor of the modular usable space 115 and connect to a roof structure 180 (FIG. 3) to provide an outer perimeter of an EMITBI enclosure with an inner volume in which IT gear can be housed. As shown by the illustrations, a plurality of modular components, some containing IT gear, such as rack-based servers, are housed within the EMITBI enclosure (110).

The plurality of exterior walls includes four walls, three of which can be permanent walls separating the EMITBI 110 from the AHUs 120 and PSD system 130, respectively. As illustrated, two of the external walls, referred to herein as side walls, have one or more AHUs 120 located outside of side walls, each AHU 120 being adjacent to a corresponding AHU bay 122 and in fluid communication with the section of the EMITBI 110 that is located on the inside of the side wall. Each section of the EMITBI 110 that is served by an AHU 120 includes a plurality of modular components designed for enabling air circulation through IT gear located therein. A third external wall, referred to herein as a back wall, has the power supply components within the PSD system 130 located on the external side of the wall. According to one aspect of the disclosure, the EMITBI 110 enclosure includes at least one exterior wall among the plurality of exterior walls, i.e., a fourth exterior wall, which is a removable expansion wall (hereafter referred to as a REW 150). In at least one embodiment, the REW 150 can be modularly attached and/or semi-permanently attached to the adjoining side walls of the EMITBI 110. Specifically, in one embodiment, the REW 150 has a plurality of structural connecting mechanisms that allow for later de-assembly and removal of the REW 150 without affecting a structural integrity of a remainder of the EMITBI 110.

From the above description, the base EMITBI 110 includes: an initial base pad providing a fixed area of usable space 115 on which one or more modular sub-components of the LMIHS 105 can be placed; a plurality of exterior walls extending vertically from an outer perimeter of the base pad and connected to a roof structure 180, the plurality of exterior walls and roof structure 180 collectively providing an outer perimeter of an initial enclosure of the EMITBI 110, within which a first maximum number of modular components can be housed, the plurality of exterior walls including at least one exterior wall that is constructed as a removable expansion wall (REW) 150 that enables expansion of the usable space 115 of the EMITBI to include added usable space (see, e.g., added usable space 1115, FIG. 11); and a plurality of modular components 140 placed within the EMITBI 110 on the usable space 115 and operational as the LMIHS 105. The base EMITBI 110 provides a protective enclosure and/or a controlled environment within which the LMIHS 105 can operate with minimal exposure to an environment outside of the plurality of exterior walls.

Figure 4:
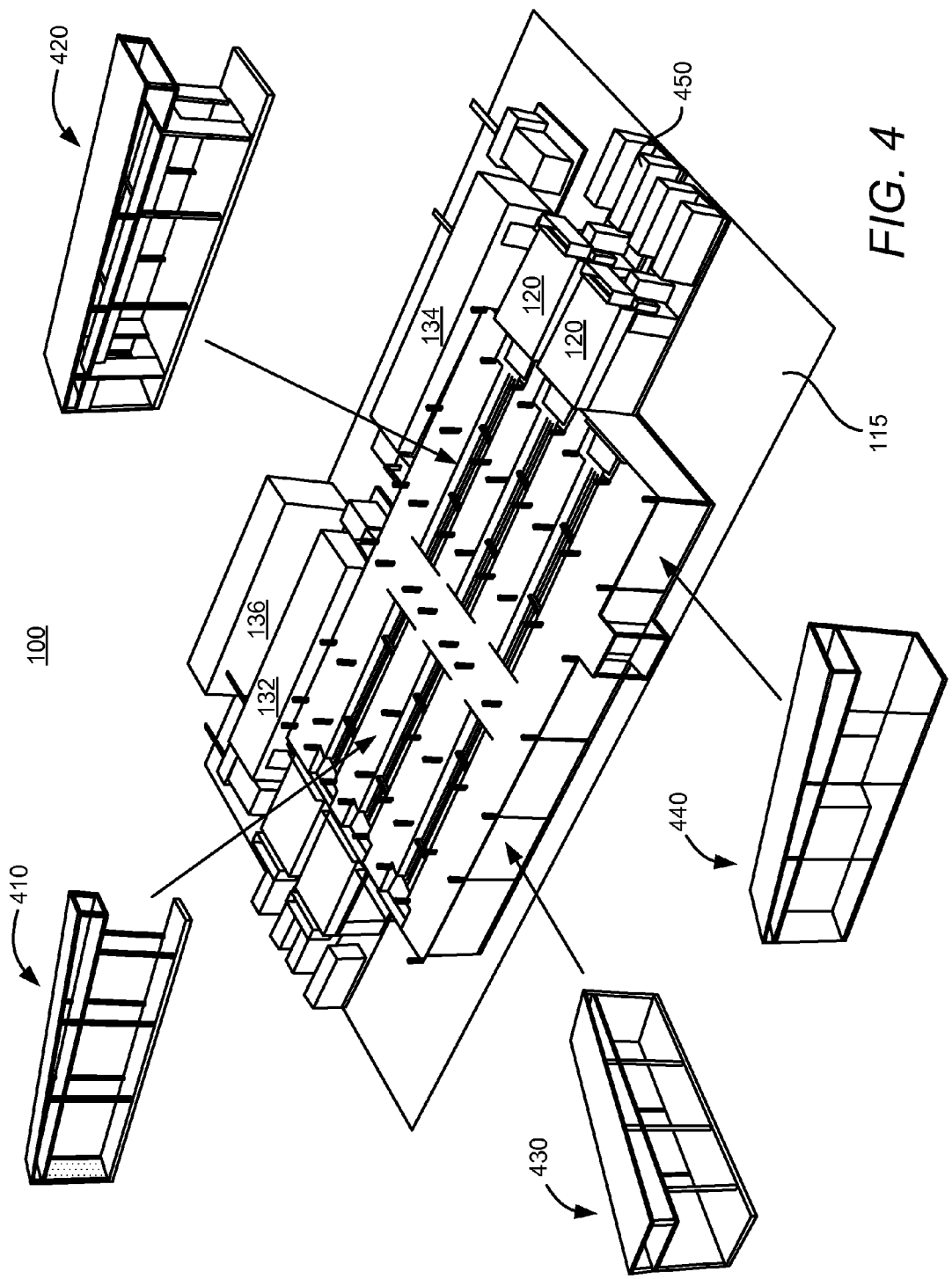
FIG. 4 illustrates one example of the relative physical placement of the different types of structural modules that are the essential modular building blocks of an EMITBI, in accordance with one or more embodiments.

FIGS. 4-8 illustrate the modular component makeup of the LMIHS 105 within the EMITBI 110, depicting also each of the modular components 140 that are placed within the EMITF 100, including power and cooling components thereof. Within this grouping of figures, FIG. 4 illustrates one example of the relative physical placement of the different types of structural modules that are the essential building blocks of a fully assembled and operational LMIHS 105 and/or EMITBI 110, in accordance with one or more embodiments. FIG. 4 shows a representative layout of the EMITBI 110, including specific placement and/or arrangement of the modular components on the usable space to provide hot and cold aisles, with the AHUs aligned on the exterior to provide cooling to an adjacent set of modular components. Among these modular components are cold aisle module 410, hot aisle module 420, and one or more multipurpose modules, of which network module 430, and storage module 440 are provided as examples. In one embodiment, the multipurpose module can also represent a workspace. As illustrated by FIG. 4, these different types of modular components are the essential building blocks of a fully assembled and operational LMIHS 105 and/or EMITBI 110. Of particular importance to the operation of the LMIHS 105 are cold aisle modules 410, which contain a majority of the heat generating IT components that require cooling. This cooling is supplied by an AHU 120 that is placed in fluid communication with the particular cold aisle module 410 and paired hot aisle module 420.

Figure 5:
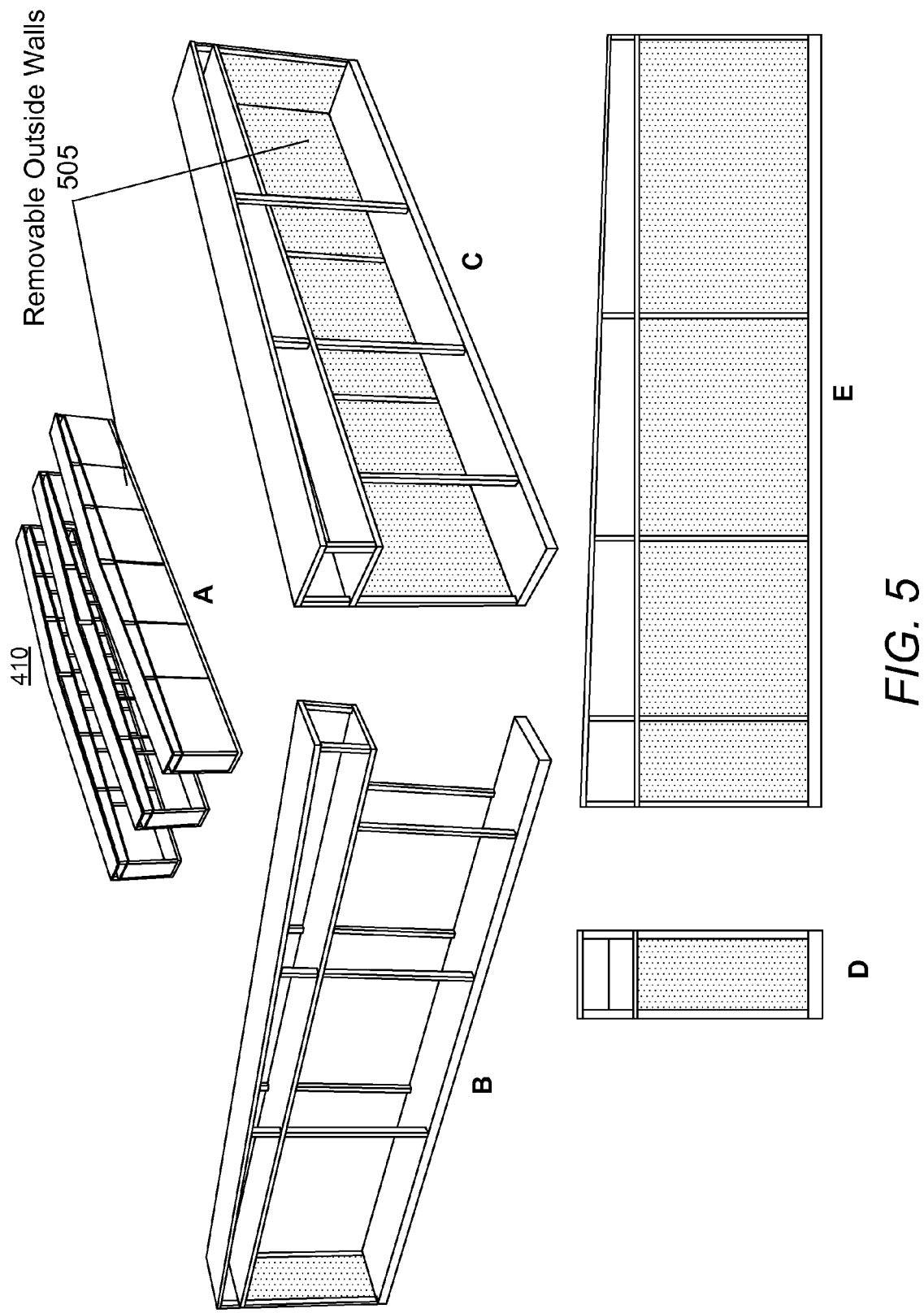
FIG. 5 illustrates five different positional views of an example cold aisle module of an EMITBI, in accordance with one or more embodiments.

At least one IT rack includes information technology (IT) gear that can be operated within the EMITBI 110. The at least one IT rack can be housed within a cold aisle module 410 (FIGS. 4 and 5). The EMITBI 110 provides an enclosure that protects the IT gear located therein and supports expansion of the LMIHS 105 contained and/or operated within the EMITF 100. According to one important aspect of the disclosure, the expansion of the EMITBI 110 and/or the LMIHS 105 occurs by adding new modules for hosting additional IT gear within an expanded usable space outside the REW 150, without affecting the operation of existing IT gear within the initial base area of the EMITBI 110.

Figure 6:
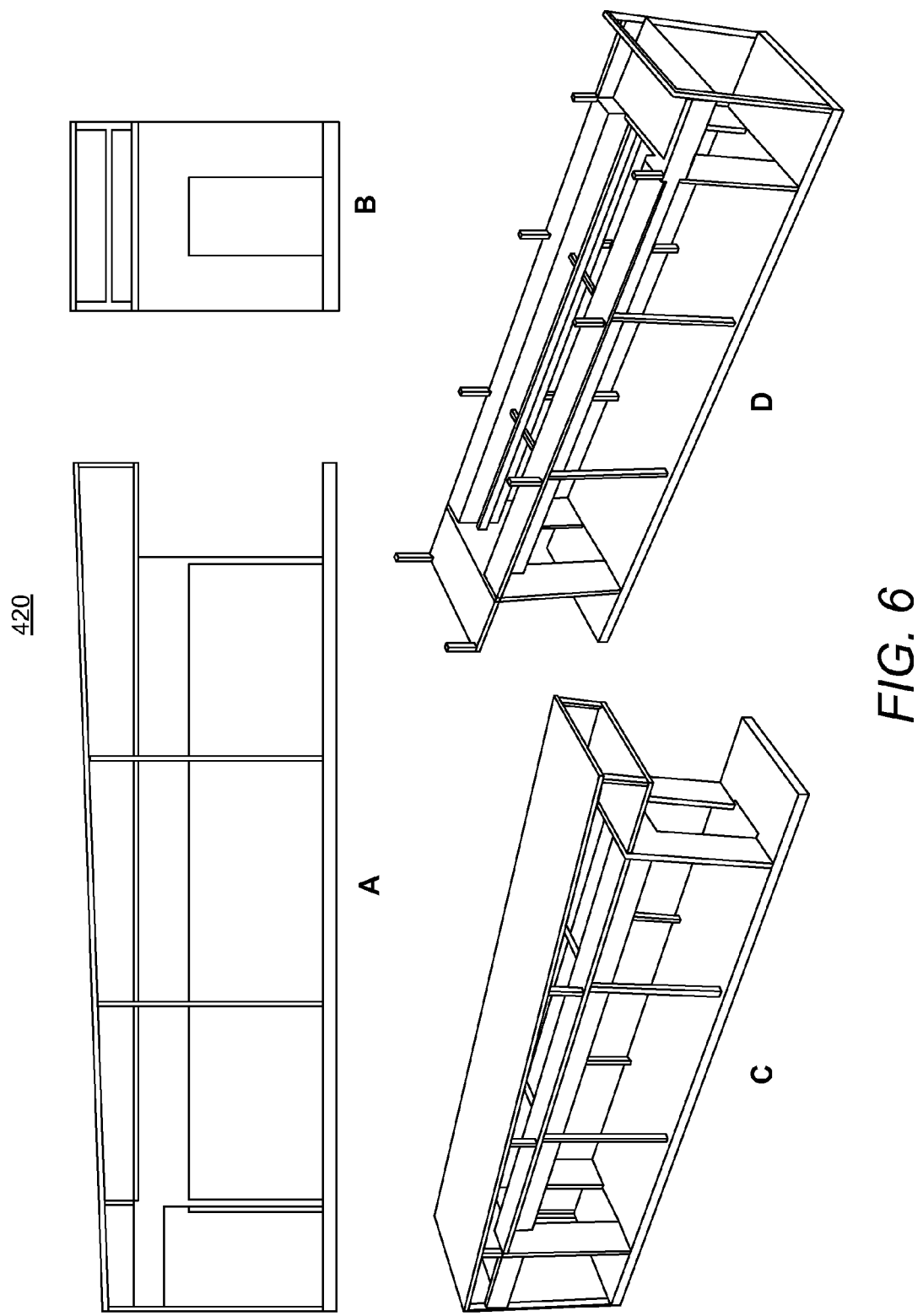
FIG. 6 illustrates four different positional views of an example hot aisle containment module of an EMITBI, utilized to host one or more rack-mounted and/or stand-alone IT gear, such as an information handling system, in accordance with one or more embodiments.
Figure 7:
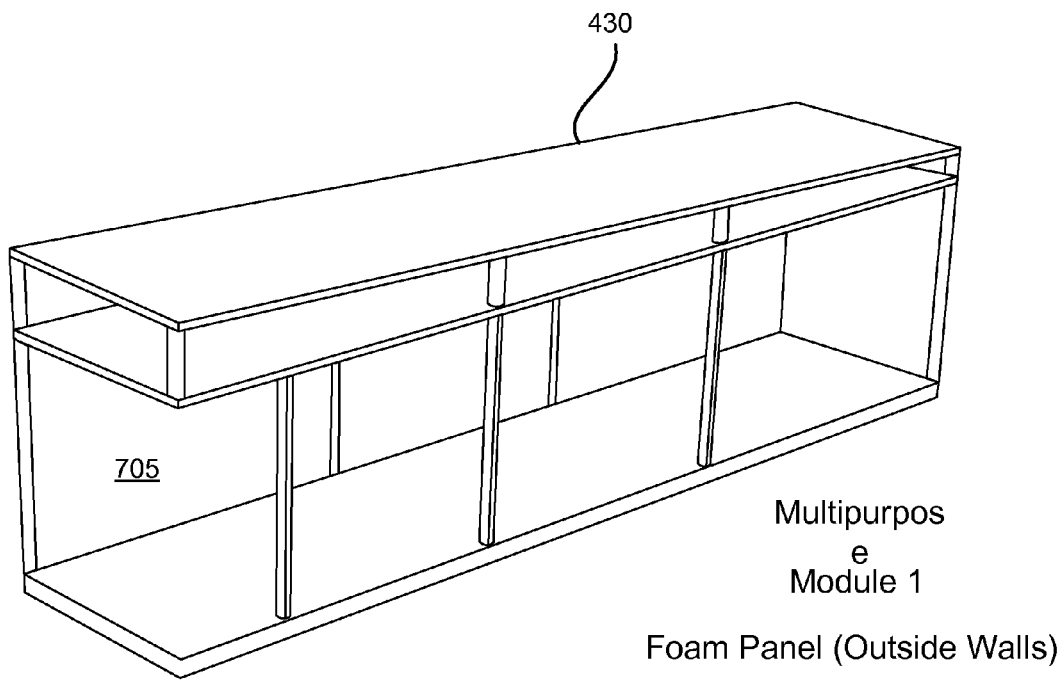
FIGS. 7 and 8 illustrate two examples of multipurpose modules that can be utilize within the EMITBI, and which can provide a back panel that can be utilized as one part of a removable outside/expansion wall, in accordance with one or more embodiments.
Figure 8:
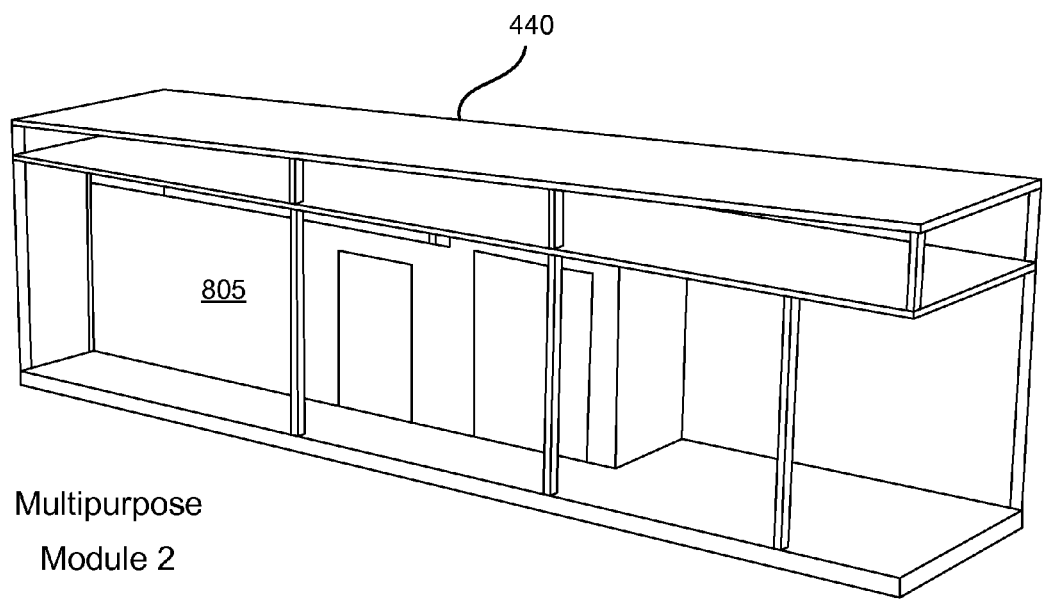

FIGS. 5 and 6 respectively illustrate physical aspects of cold aisle module 410 and hot aisle module 420. Specifically, FIG. 5 illustrates five different positional views of an example cold aisle containment module 410 of an EMITBI 110, utilized to host one or more rack-mounted and/or stand-alone IT gear, such as an information handling system, in accordance with one or more embodiments. FIG. 6 illustrates four different positional views of an example hot aisle module 420 of an EMITBI 110, which are configured to direct or channel hot exhaust air to the outside of the EMITBI 110 and away from the functioning IT gear, in accordance with one or more embodiments. FIGS. 7 and 8 respectively illustrate different embodiments of multipurpose modules, specifically representing network module 430 and storage module 440. FIG. 7 illustrates an example network module 430 of the EMITBI 110, which provides a back panel that can be utilized as one part of the outside wall, in accordance with one or more embodiments. And, FIG. 8 illustrates an example storage module 440 of the EMITBI 110, which provides a back panel that can be utilized as one part of the outside wall, in accordance with one or more embodiments. It is appreciated that these multipurpose modules can be provisioned to provide other functionality within the EMITBI 110 and that the specific illustration of a network module 430 and storage module 440 is not intended to be limiting with respect to the broader application of the multipurpose modules within the disclosure.

The general manner in which these various component modules (of FIGS. 5-8) are designed, assembled, arranged within the usable space 115, and made operational (when used to house functional IT gear) within a LMIHS 105 is not the focus of this disclosure and is therefore not further described herein. Of importance to the disclosure is the modularity of the components, which enables additional ones of the modular components to be assembled within the usable space, as needed, when the number of computing modules of the LMIHS is to be physically increased. In one embodiment, network module 430 and storage module 440 are located along the removable exterior wall side of the EMITBI 110, allowing for the possible use of the back panels of these components as a segment of the REW 150.

According to one embodiment, the REW 150 includes and/or is designed with a plurality of structural connecting mechanisms that allow for later de-assembly and removal of the REW 150 without affecting a structural integrity of a remainder of the EMITBI 110. The REW 150 is affixed in place at the abutting ends of the adjacent exterior walls. The REW 150 can include one or more structurally rigid panels having interlocking and release mechanisms (LRMs) 155 that are only accessible from an interior side of the enclosure when the REW 150 is physically attached to the adjacent exterior side walls. Each of the adjacent exterior walls and the base pad includes a latching mechanism at a physical connecting point at which the REW 150 physically connects to the adjacent exterior walls and the base pad. In one embodiment, the REW 150 includes a plurality of panels that interlock with adjacent panels to create a single physical structure. The REW 150 can also include a structural exterior frame with flanges attached to and extending vertically along a perimeter edge of each abutting, adjacent exterior wall.

In one embodiment, at least one removable section of the REW 150 is non-load bearing, and at least two of the remaining exterior walls are permanent walls that provide load bearing support to the roof structure 180 and any ceiling 185 (optional) of the EMITBI enclosure. With this construction, removal of the at least one removable section of the REW 150 does not negatively affect a structural integrity of the EMITBI 110. Additionally, in one embodiment, the at least one removable section of the REW 150 is assembled around one or more support columns that are affixed to a foundation or base pad of the EMITBI 110 and which extends upwards to support the ceiling 185 (if any) and roof structure 180. Also, with this implementation, de-assembly and removal of the REW 150 includes removal of the at least one removable section without removing the one or more support columns.

In yet another embodiment, the REW 150 is constructed of one or more materials that exhibit structural rigidity when vertically extended from the base pad to the ceiling 185. The material make-up of the REW 150 enables the REW 150 to provide a physical and environmental barrier to seal the enclosure and prevent physical access to the IT modules within the enclosure, while preventing exposure of the IT gear to a surrounding external environment. Also, at least a main structural material of the REW 150 is durable and lightweight. And as an additional aspect of the disclosure, the REW 150 is re-usable. While specific aspects of example embodiments of the REW 150 are being provided, it is appreciated that a bare bones construction of the REW 150 is all that is required for implementation of the expandable EMITBI 110 and the specific functionality of a removable wall, as described herein.

In one embodiment, the base pad and the one or more of the abutting exterior walls contain expansion facilitating affordances (EFA) (not specifically shown) at their respective perimeter edges that abut and/or are proximate to the exterior perimeter (sides and bottom) of the REW 150. The EFAs enable further construction and expansion of the respective pad or wall that extends the particular pad or wall to enable construction of a second segment or area of the EMITBI 110. The newly constructed second segment/area directly abuts and extends laterally from the first (base) section of the EMITBI 110 to increase the interior area of the enclosure (i.e., the usable space) within a single contiguous structure having extended exterior side walls, extended or additional roof structure, and expanded usable space 115. Additionally, the EFA enables horizontal attachment by, and provides initial structural support for connecting, a newly-constructed or newly-installed abutting exterior side wall and base pad for added usable space that respectively extends in a same lateral direction as the existing side walls and initial usable space 115. According to one important aspect of the disclosure, the entire expansion of the EMITBI occurs while the REW 150 remains physically in place to shield the IT gear located within the base EMITBI 110 during construction of the adjoining expansion segment/area. The functionality of the REW 150 being removable post-construction enables this feature of the disclosure.

Additionally, in one embodiment, the REW 150 is physically located a pre-set distance inside of an exterior edge of a perimeter of the base pad of usable space 115, exposing an expansion connecting edge of the base pad on an exterior side of the REW 150. With this construction, one or more of the abutting exterior walls and the roof structure can be directly tied into and connected with the initial structures and extend laterally beyond a vertical plane along the back of the REW 150 to support structural integration/connectivity of the new walls and base pad during later expansion of the base EMITBI 110.

Figure 9:
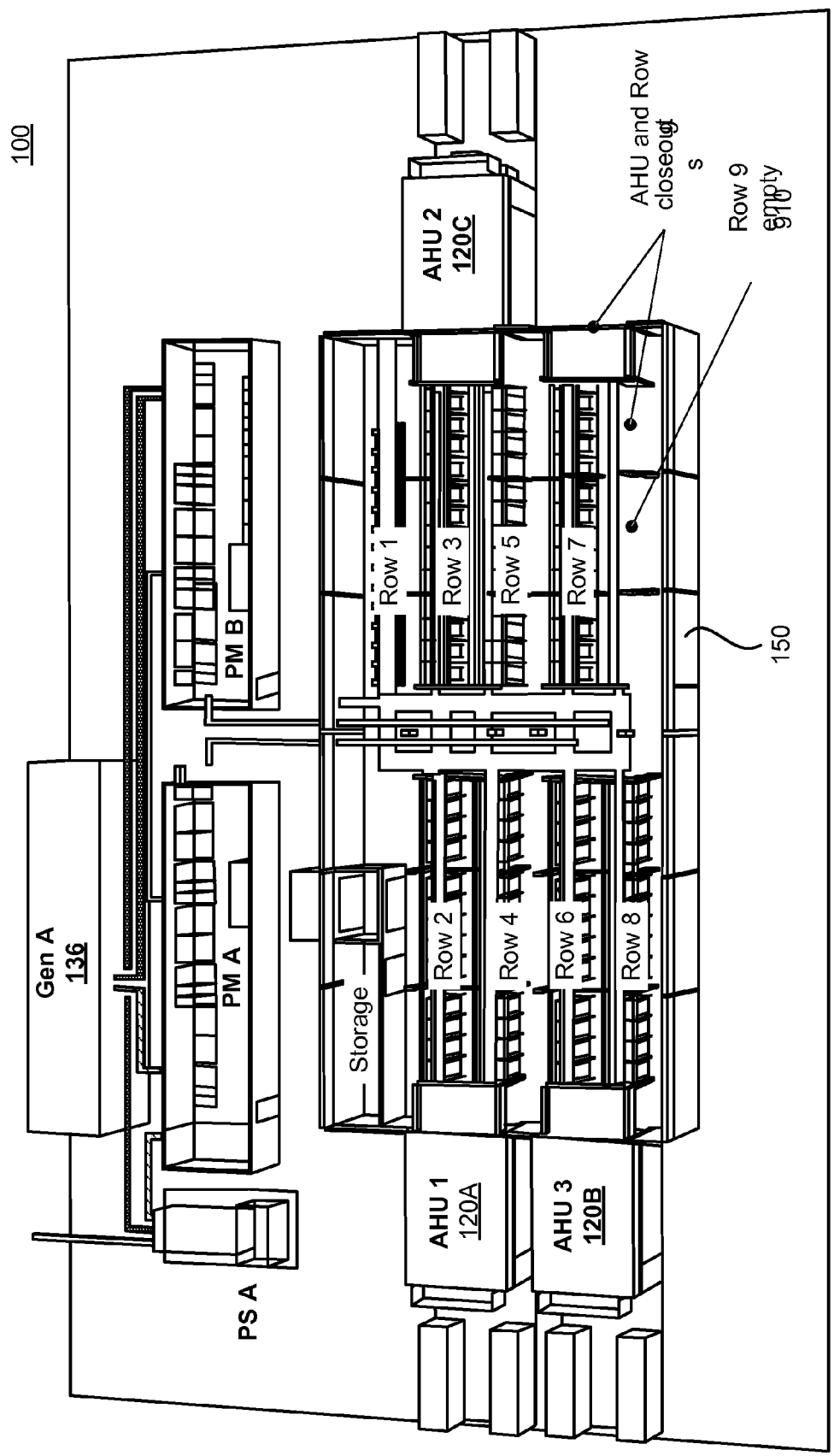
FIG. 9 provides a top view of an example baseline EMITBI with modularly-assembled racks of IT components placed on the initial usable space located on an interior side of a removable expansion wall (REW), according to one or more embodiments.

Reference is now made to the sequence of figures from FIG. 9 through FIG. 15 and with ongoing reference also to FIGS. 16-23. FIG. 9 provides a top view of an example EMITF 100 having a baseline EMITBI 110 with the relative placement of the various modular components, including those containing functional IT gear, on the initial usable space 115. As illustrated, the baseline EMITBI 110 includes an empty row 910 within the initial usable space 115 that can be utilized for further expansion of the LMIHS 105 by introducing an additional cold aisle module 410 with functional IT gear. Notably, as shown by the figure, the empty row 910 is physically located on the interior of the EMITBI 110, behind the REW 150. In the described embodiments, the REW 150 is modularly-attached and/or modularly-constructed and independently removable, indicating that the removal of the REW can be accomplished in sections, without destroying the wall or damaging the remainder of the EMITBI 110. Notably, in this baseline figure, eight rows of modular components of the LMIHS 105 are provided, with each pair of IT gear supporting rows, comprising a hot aisle module 410 and a cold aisle module 420, having an associated AHU 120 assigned thereto (labeled as AHU 1 120A, AHU 2 120B, and AHU 3 120C, but collectively referred to herein as AHU 120). Each AHU 120 is located on the exterior of a side wall of the EMITBI 110, and is in fluid communication with an adjacent section having a pairing of modular IT components located on the inside of the EMITBI enclosure. It is appreciated that, while each AHU 120 is shown supplying cooling air circulation for a pair of installed modular components (specifically a pairing of a hot aisle module 420 and a cold aisle module 410), in alternate embodiments, one or more of the AHUs 120 can be configured to cool a different association of modular components, such as a single hot aisle module paired with two cold aisle modules, for example. The presented embodiments are not intended to be limiting on the disclosure.

It is also appreciated that, in its most basic configuration, a baseline EMITBI can be constructed with only a single pairing of modular components (hot and cold aisle) and associated single AHU. The presentation herein of a multi-row configuration of modules and the plurality of initially-provided AHUs in the baseline EMITF is intended to focus the expansion of the EMITBI as it transitions from an almost full baseline EMITBI to a full capacity EMITBI that would then trigger use of the expansion capability provided by the REW 150 when more IT gear is required to be added within the single contiguous building infrastructure.

Figure 10A:
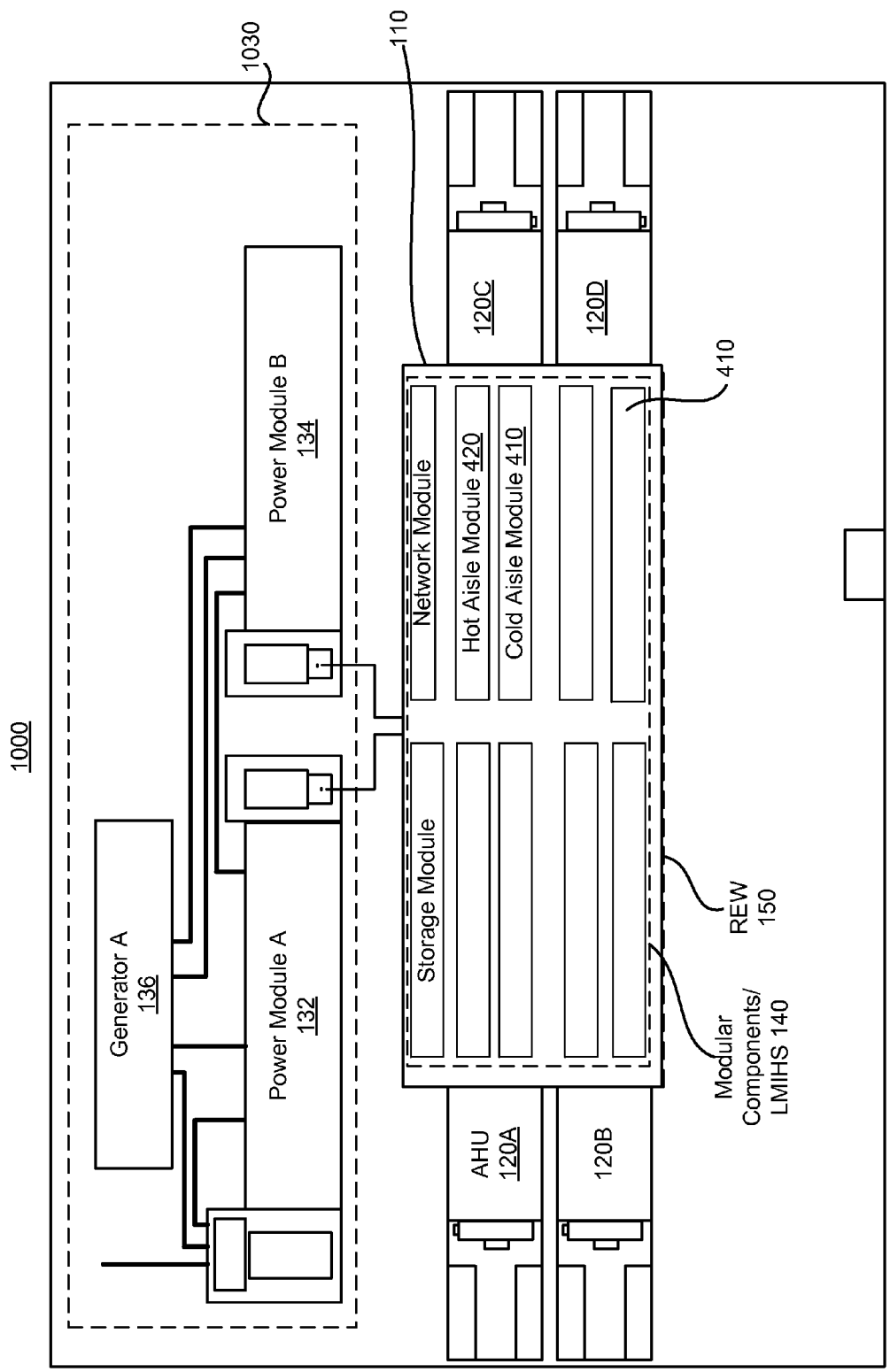
FIGS. 10A and 10B respectively provide a block diagram and a three dimensional view depicting a first expansion of the baseline EMITBI to provide additional modular IT components at the remaining available space within the EMITBI and the accompanying addition of an AHU to bring the usable space of the EMITBI to full capacity, according to one embodiment.
Figure 10B:
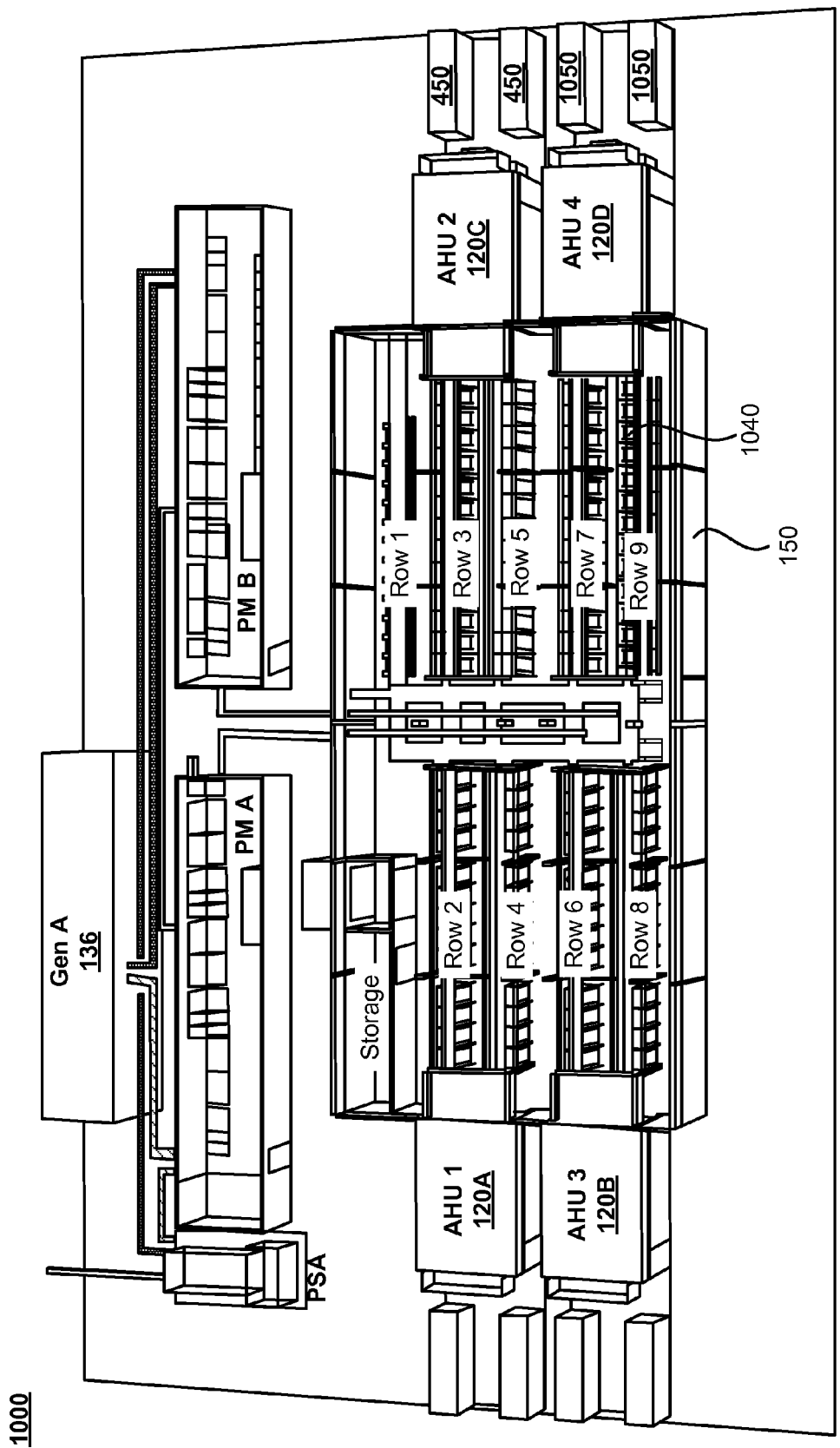

FIGS. 10A and 10B respectively provide a block diagram and a three dimensional view illustrating a first expansion of the baseline EMITBI to provide additional modular components at the available remaining space within the EMITBI in order to bring the usable space 115 of the EMITBI to full capacity. The figures further illustrate the accompanying addition of an AHU 120D to the adjacent AHU bay 122D to provide the required cooling for the added IT components. Notably, the first expansion of modular components includes the addition of a cold aisle module 410 containing one or more IT racks of IT gear, in one embodiment. The cold aisle module 410 is paired with the existing (or concurrently installed) hot aisle module 420 and fills up the empty row 910 (FIG. 9) within the baseline EMITBI 110. In an alternate implementation, both the cold aisle module 410 and hot aisle module 420 are added contemporaneously with each other. This installation of these modules brings the initial usable space 115 to full capacity, whereby no additional modules can be physically supported by the baseline EMITBI 110. Prior to or concurrent with the introduction of the cold aisle module 410, an AHU 4 120D is added to the adjacent exterior space to support the cooling of the newly added IT gear placed within the newly added cold aisle module 410. FIGS. 10A-10B thus provide a full capacity baseline EMITBI 110 with corresponding AHUs 120.

Figure 11A:
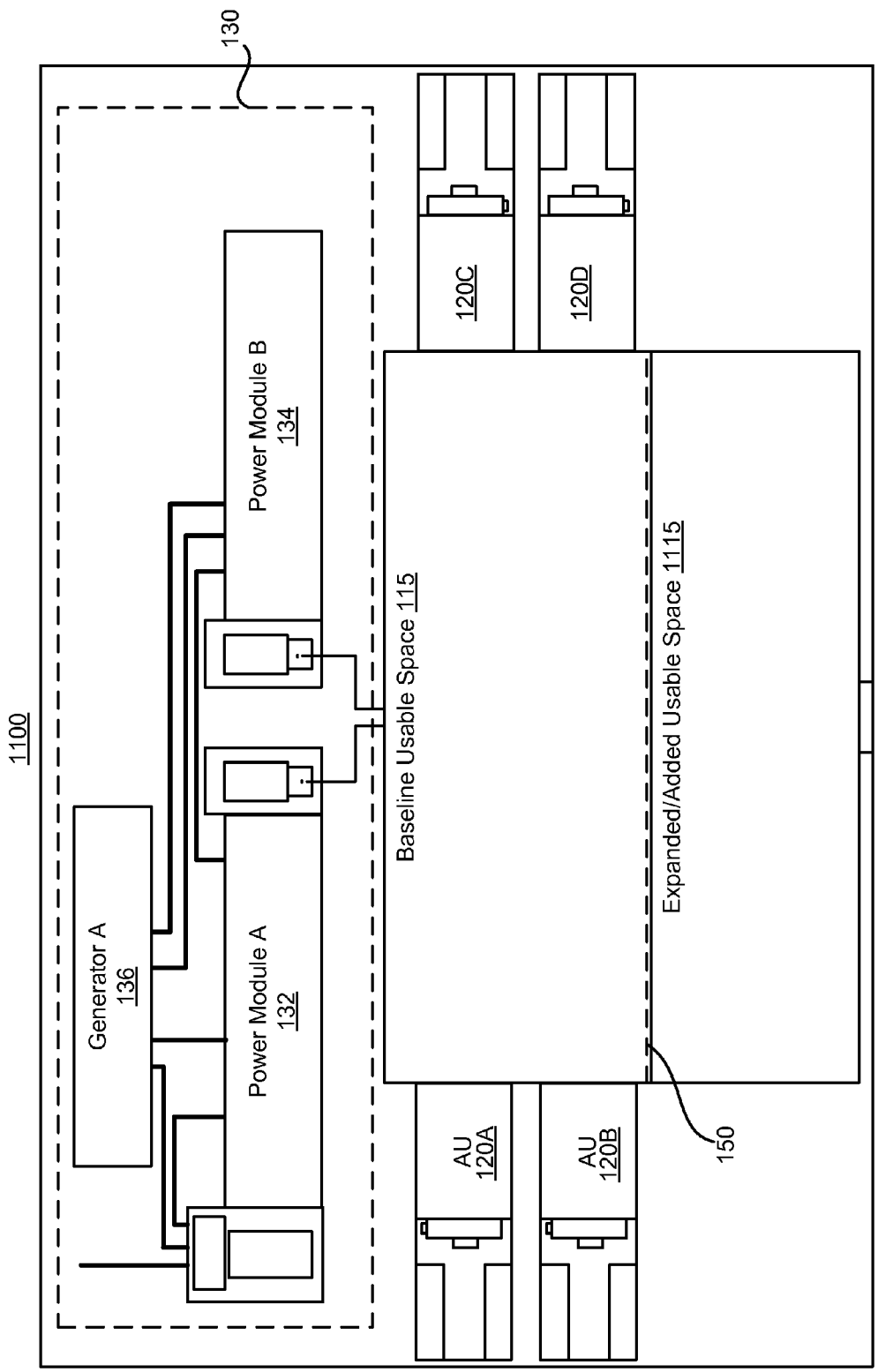
FIGS. 11A and 11B respectively provide a block diagram and a three dimensional view depicting an initial expansion stage involving construction and/or installation of additional usable space and structural components at the exterior of the REW and directly adjacent and/or abutting the initial usable space, without removing the REW and without disrupting the operation of the EMITBI, in accordance with one or more embodiments.
Figure 11B:
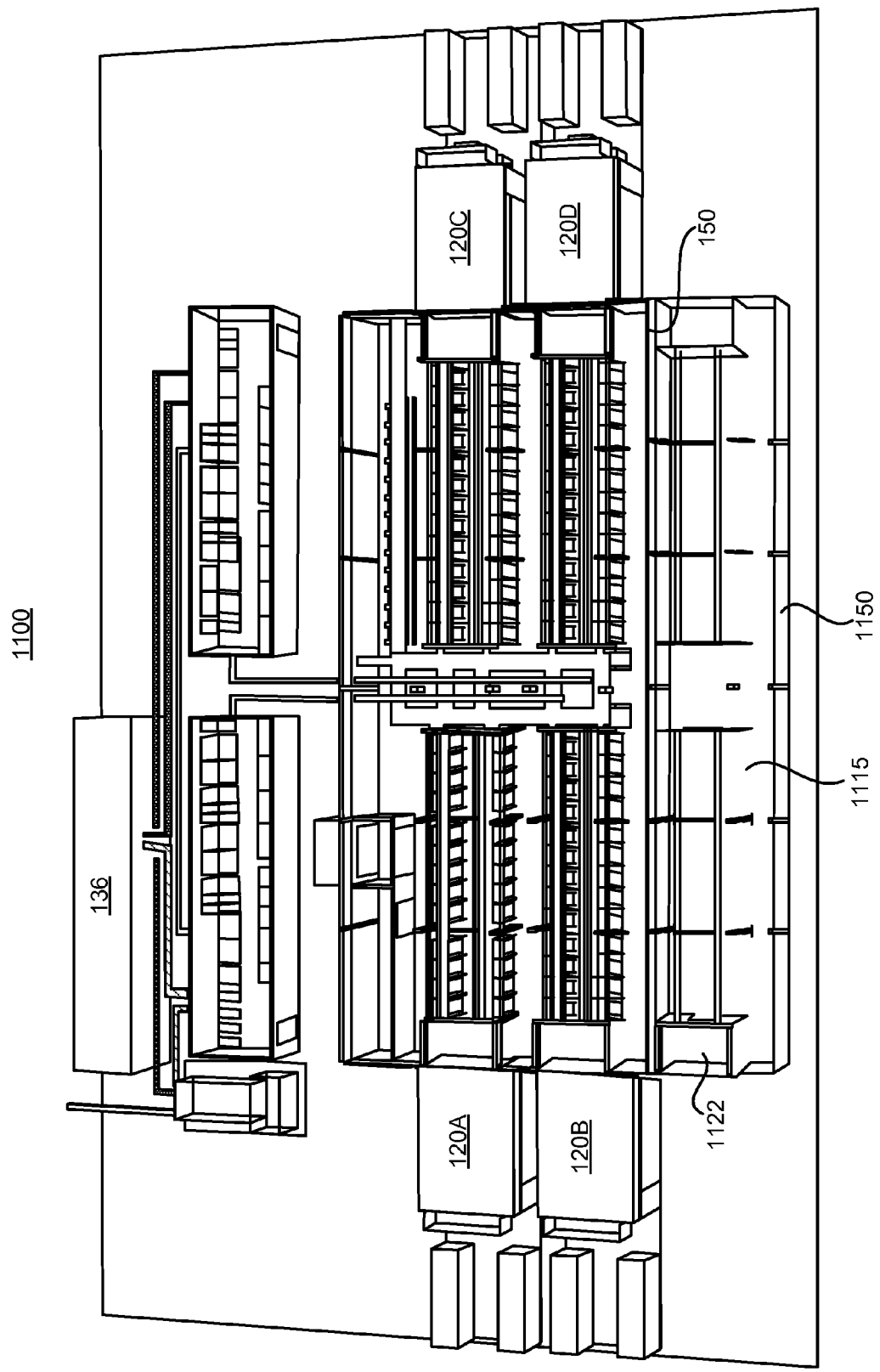

FIGS. 11A and 11B respectively provide a block diagram and a three dimensional view depicting an initial expansion stage involving construction and/or installation of a base pad for additional usable space 1115 and the various structural components (not shown) to support addition of the additional modular components. The additional usable space 1105 extends from and/or is directly adjacent to the position of the REW 150 (indicated by dashed lines in FIG. 11A) and abuts the perimeter edge of the initial usable space 115 below the vertically extending REW 150. As illustrated by the figures, construction and/or installation of the expanded usable space is completed without removing the REW 150, in order to avoid having to shut down or otherwise disrupt the operation of the IT gear within the initial EMITBI 110, in accordance with one or more embodiments. This expansion of the usable space 115 can involve building of a base floor pad that directly abuts the perimeter edge of the initial usable space 115 (within the baseline EMITBI 110) located below the vertically-extending REW 150. In addition to the additional usable space 1115, the expansion includes the construction or installation of exterior side walls, ceiling and/or roof support structures, and a new external wall 1150. The expansion thus involves constructing only three walls, rather than four walls as would be required for an entirely new EMITBI 110. Additionally, by constructing the expansion space directly adjacent to the existing EMITBI 110 and outside of the REW 150, without removing the REW 150, the expansion is permitted to occur without disrupting the operation of the IT components within the baseline EMITBI 110 and/or without introducing exposure to outside weather conditions and possibly contaminants while the IT gear within the baseline EMITBI 110 is functioning.

In addition to the exterior walls, the initial expansion space (usable space) 1115 is constructed to include internal structures that support addition of the modular components, and particularly a cold aisle module and a hot aisle module. The internal structures provide a left hand side section and a right hand side section for assembly of the modules. Each section further includes an AHU connecting bay 1122 located along the extended side wall. These AHU bays 1122 enable connection by an externally-located AHU 120 to provide fluid communication with the modular components to be added to the particular section of the expanded EMITBI 110. Notably, in one embodiment, the external door of the facility is constructed within the new exterior back wall to enable access to the additional usable space 1115. It is appreciated that in at least one embodiment, the new exterior wall may be put in place only after installation of the hot aisle module and possible after installation of the cold aisle module. There various installations assume that the roof structure is also physically extended over the expanded usable space 1115. In at least one embodiment, the new external wall 1150 is also a removable external wall that would support even further expansion of the once-expanded EMITBI 1110 once the current additional space fills to capacity, or at some future time when there is a desire to further expand the once-expanded EMITBI 1110. In the illustrated EMITBI of FIGS. 10 and 11, the usable space can be devoid of any power, cable trays, VESDA, networking, or racks. The entire expanded usable space 1115 can remain unoccupied until there is a need for the added IHS capabilities.

Figure 12:
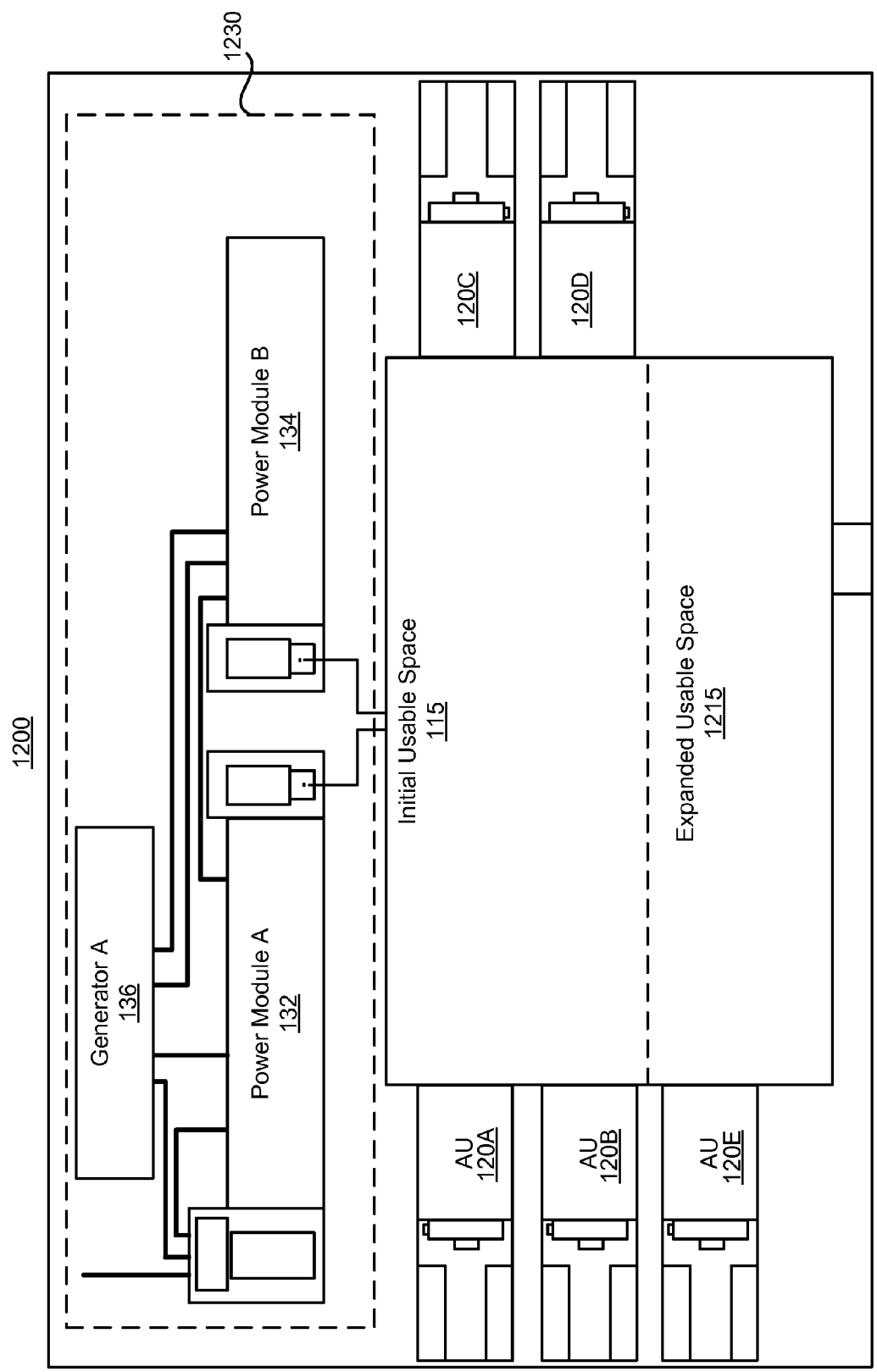
FIG. 12 depicts the additional expansion stage of adding an AHU to the side of the expanded usable space, while the REW remains in place, to provide cooling support for IT modules to be added within the expanded usable space, without disrupting the existing operation of the EMBRI, in accordance with one embodiment.

FIG. 12 depicts the additional expansion stage that includes adding an AHU 120E to one AHU bay 1122 (FIG. 11) on the side of the expanded usable space 1215, to be in fluid communication with the modular components (see FIG. 13) adjacent to the AHU bay 1122. Notably, this addition occurs while the original REW 150 remains in place so as to not disrupt the existing operation of the baseline EMITBI 110, in accordance with one embodiment. This further addition of the AHU 120E while the REW 150 is in place supports the addition of more modular components (e.g., racks) within the expanded usable space 1215 without disrupting the existing operation of the IT gear housed within the baseline EMITBI 110, in accordance with one embodiment. The additional AHU 120E is required to provide cooling for the additional IT gear to be provided within the expanded usable space 1215.

Figure 13A:
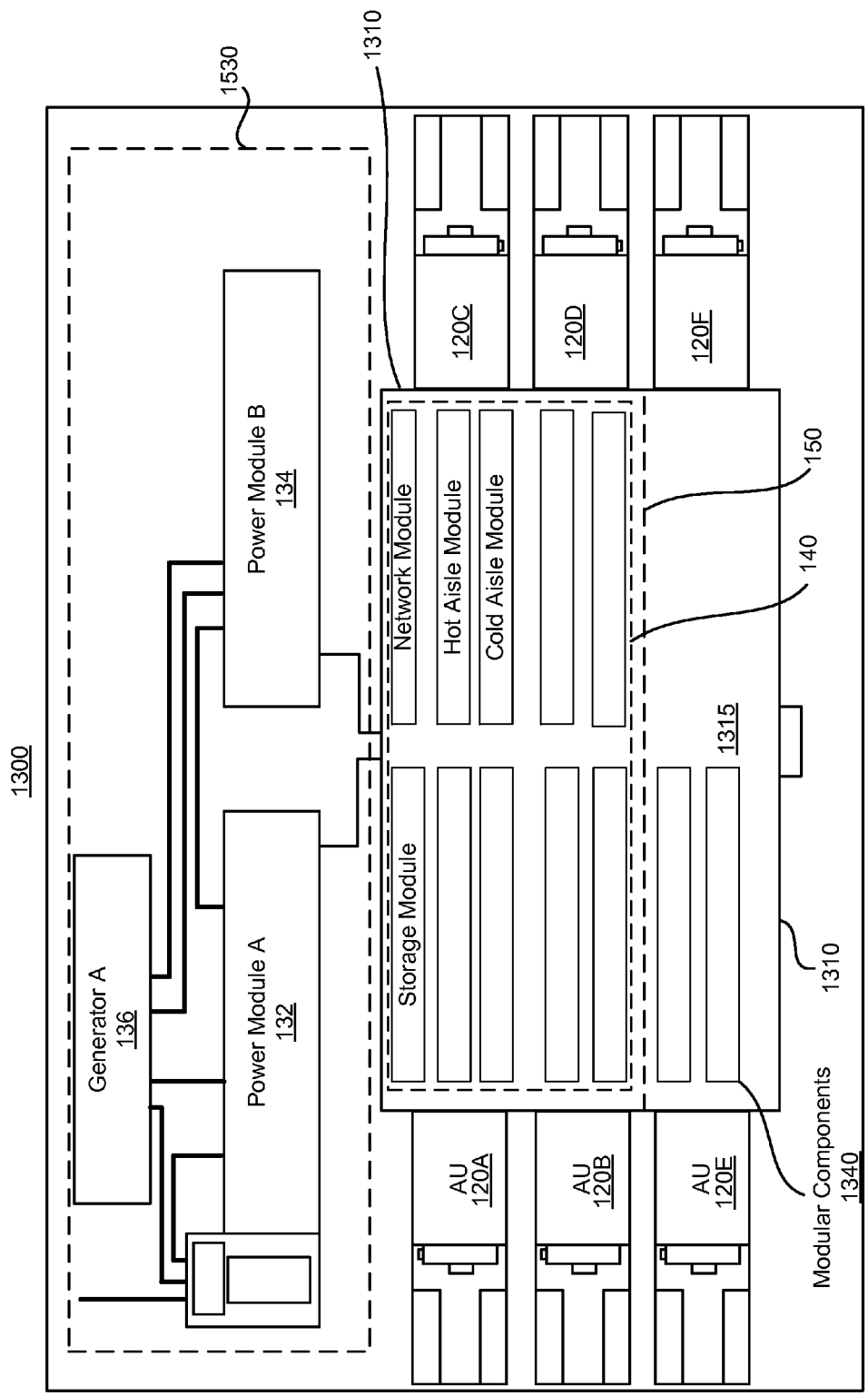
FIGS. 13A and 13B respectively provide a block diagram and a three dimensional view depicting the additional expansion stage of adding modular IT components within the enclosure of the expanded usable space, while the REW remains in place to prevent disruption of the ongoing operation of large scale IHS located on the initial usable space within the base EMITBI, in accordance with one embodiment.
Figure 13B:
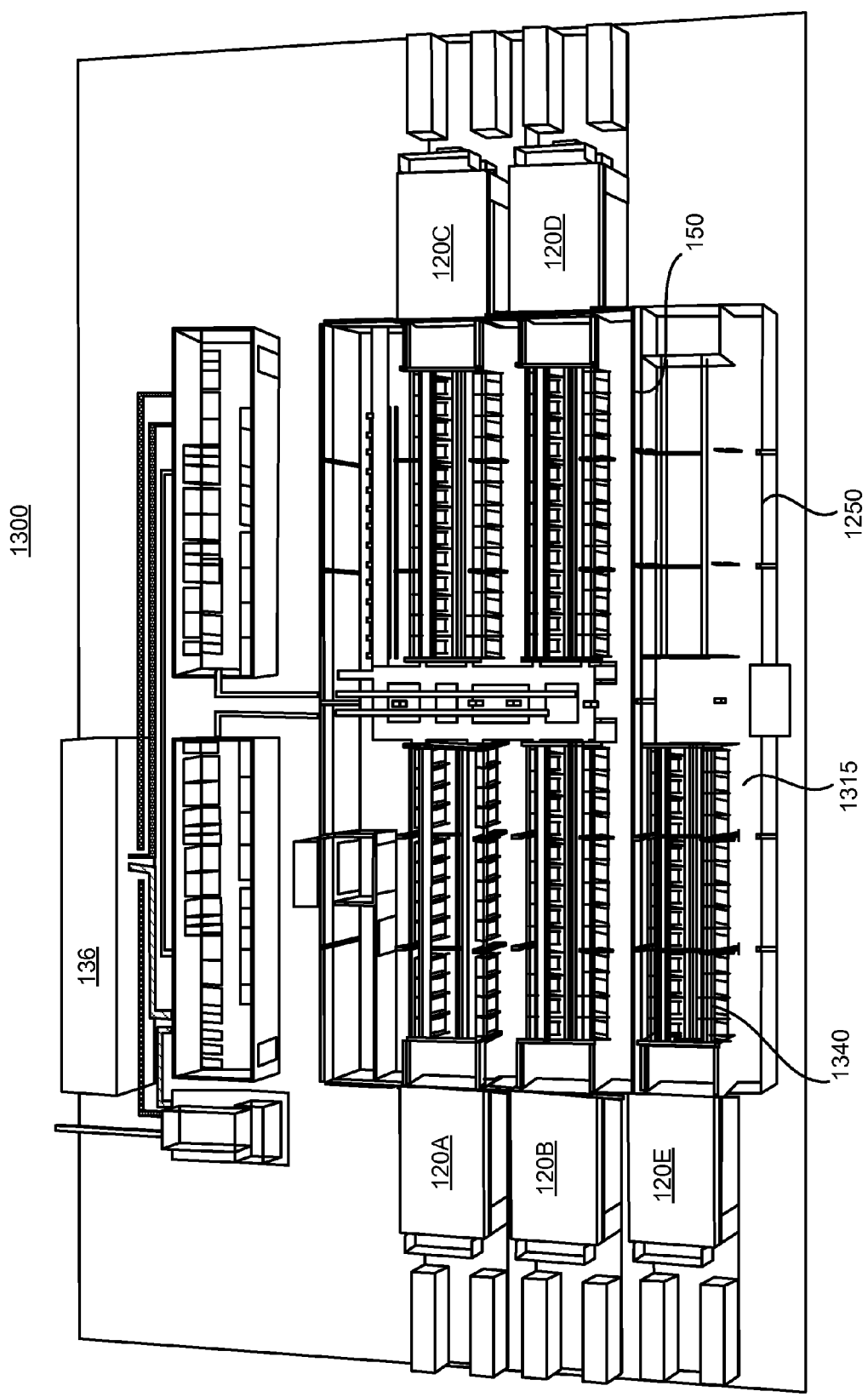

FIGS. 13A and 13B respectively provide a block diagram and a three dimensional view depicting the additional expansion stage of adding the modular components 1340 to the expanded usable space 1315. Again this addition of the modular components 1340, namely a hot aisle module and a cold aisle module, while the REW 150 remains in place, prevents disruption of the ongoing operation of LMIHS 105 located on the initial usable space 115 within the baseline EMITBI 110, in accordance with one embodiment. FIG. 13A specifically illustrates the addition of a new cold aisle module, which will contain IT gear that is to be cooled by the added AHU 120E, within the expanded usable space 1315.

Figure 14A:
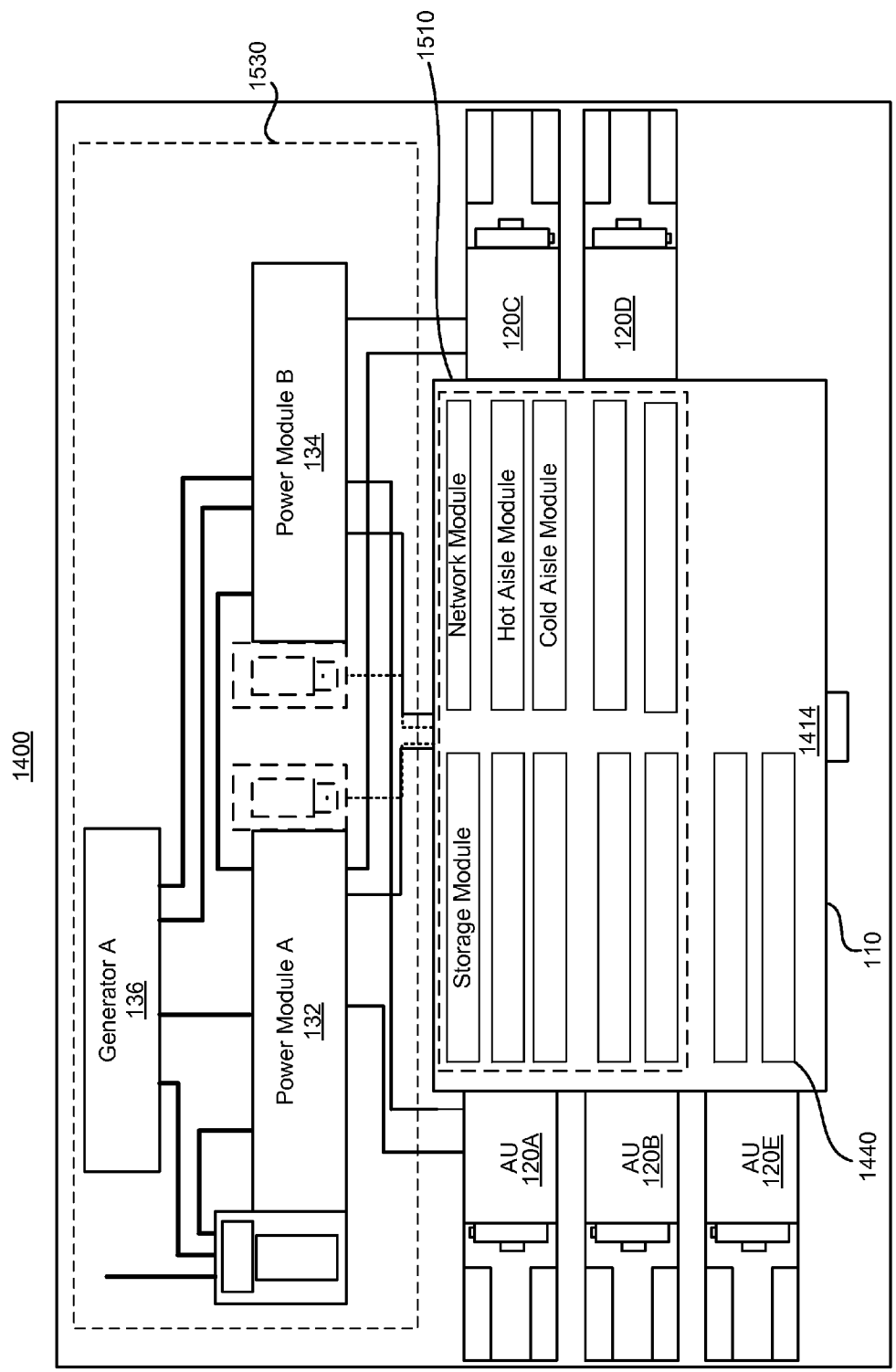
FIGS. 14A and 14B illustrate the removal of the REW to create a contiguous expanded EMITBI having expanded usable space, that allows for addition of more modular IT components within a contiguous space, without disrupting the operation of the initial IT modules within the baseline EMITBI while the expansion is ongoing, in accordance with one or more embodiments.
Figure 14B:
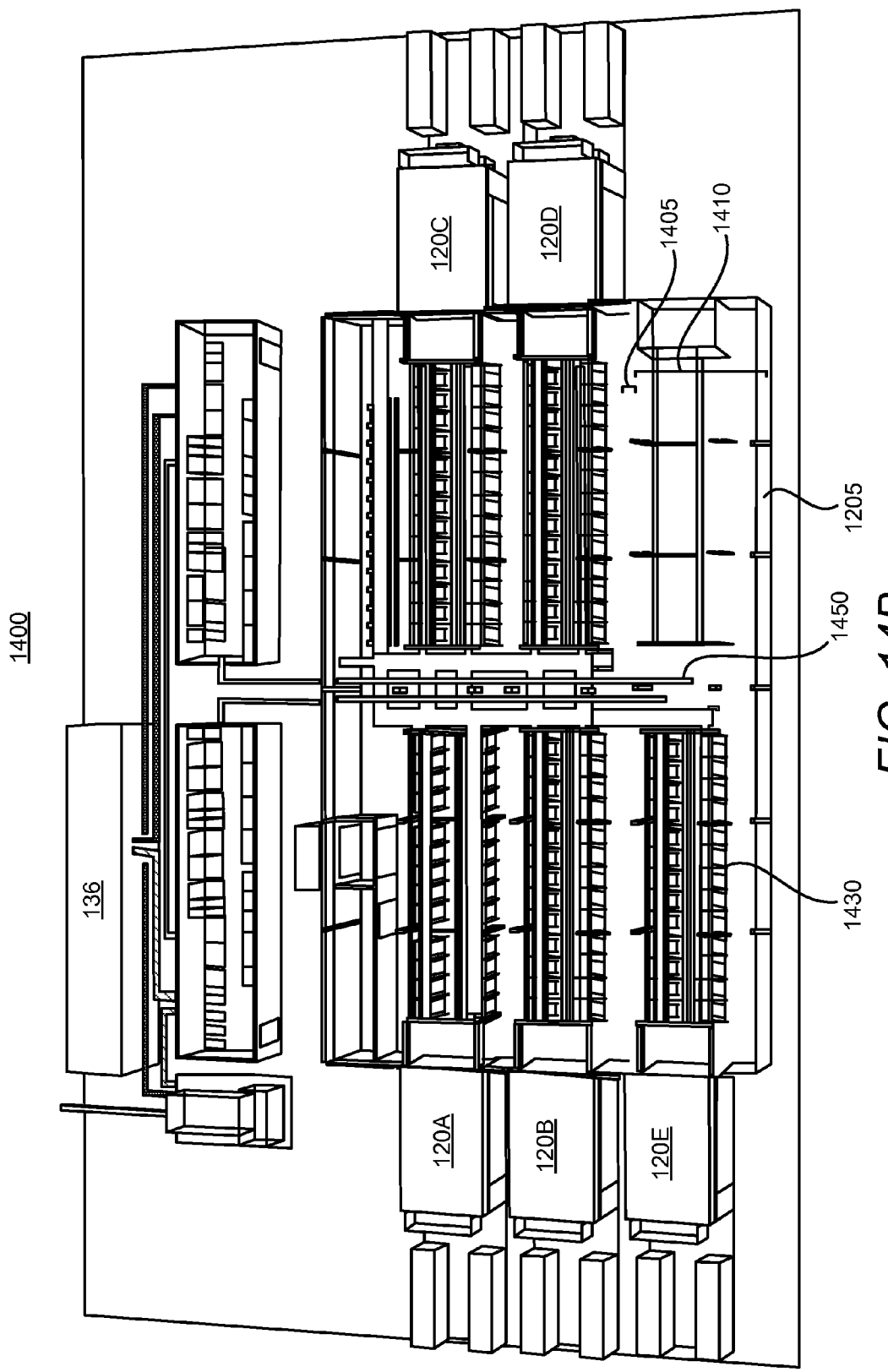
Figure 15A:
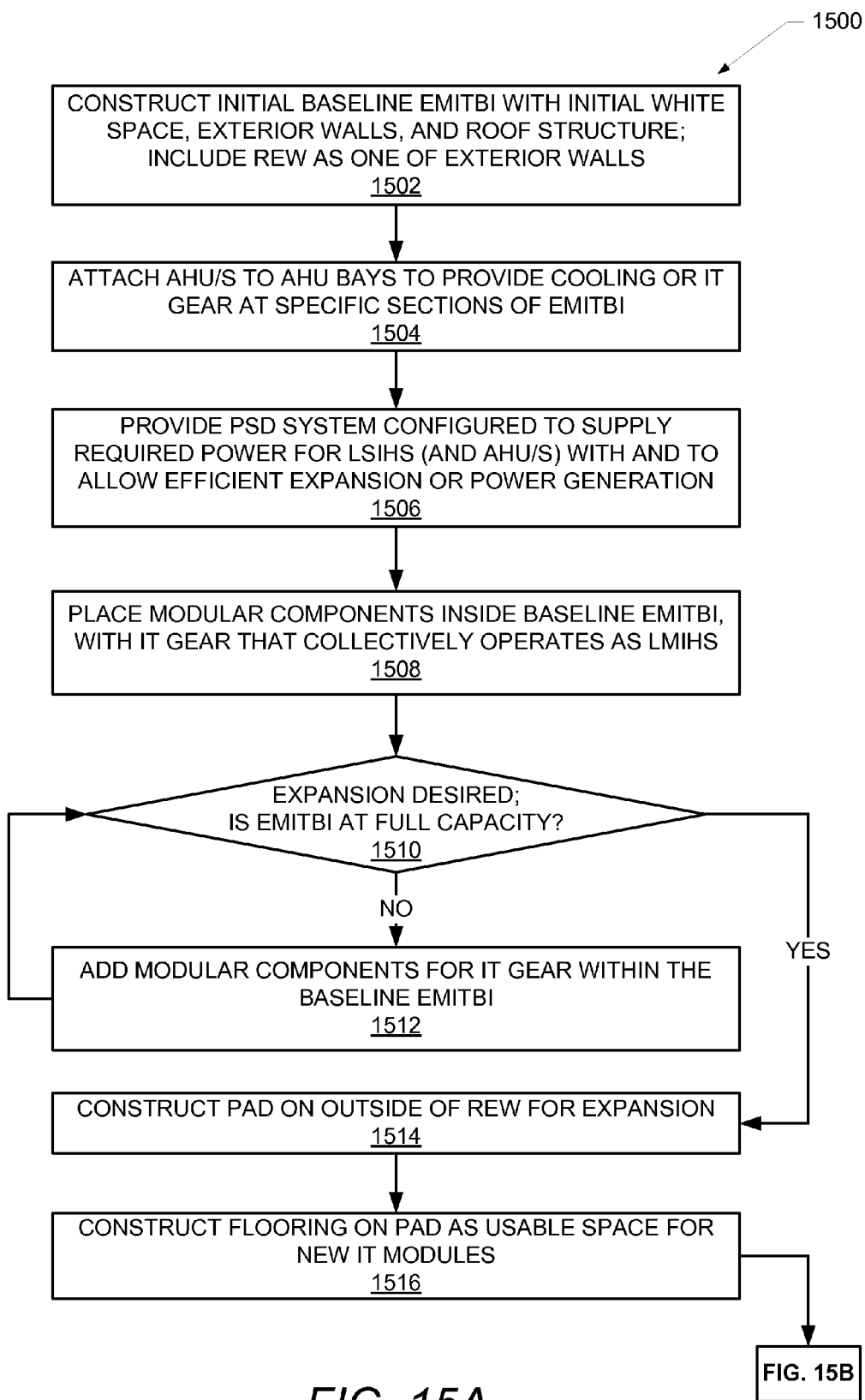
FIGS. 15 (A and B) is a flow chart illustrating a method for modularly expanding a usable space of an EMITBI during operation of existing IT modules in a baseline EMITBI, according to one or more embodiments.
Figure 15B:
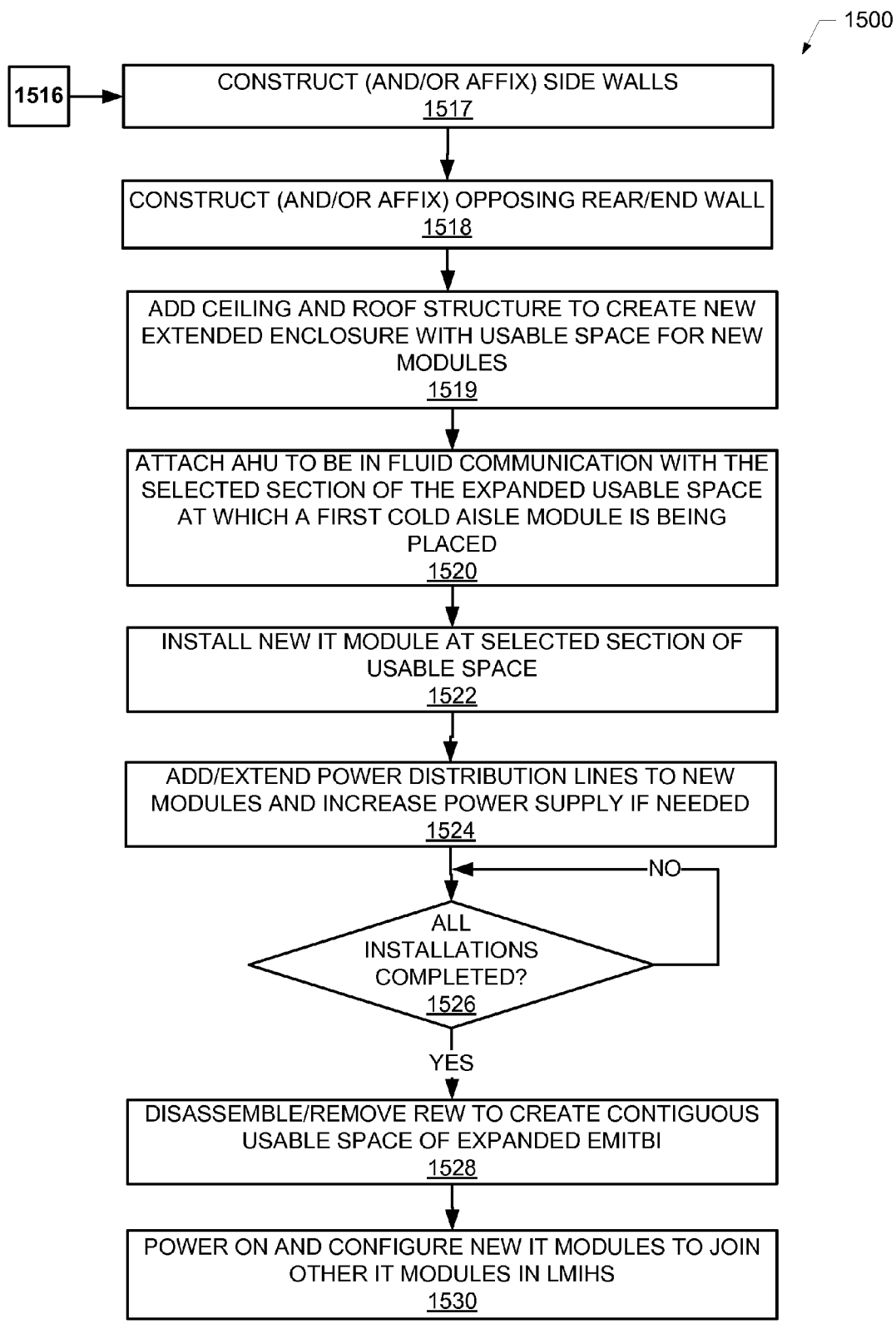

FIGS. 14A and 14B respectively provide a block diagram and a three dimensional view depicting the further expansion of the IT capacity of the expanded EMITBI 1410 and the removal of the REW (from space 1445) to create a contiguous expanded EMITBI 1410 having the initial usable space and expanded usable space 1415 as a contiguous usable space, which allows for addition of more modular components 1440 within the now-expanded EMITBI 1410. Importantly, this later removal of the REW is completed without requiring a disruption of the operation of the initial IT gear operating within the baseline EMITBI 110 during the build out of the expansion space. Appropriately, with the expanded usable space ready for installation of the IT gear, the REW 150 is disassembled and removed from the EMITBI. The removal of the REW 150 provides an expanded contiguous EMITBI 1410 that encompasses the additional usable space and thus allows for addition of more IT gear within a contiguous space. Notably, because the entry to the expanded EMITBI 1410 is in the newly added exterior wall, the added cold aisle module 410 and other IT gear can be brought into the expanded EMITBI via the door in the new external wall.

It is appreciated that further expansion of the usable space may be supported where (i) the new external wall was constructed as a REW and (ii) additional area exists on the outside of the expanded EMITBI adjacent to the new REW to support (a) further expansion of usable space surrounded by structural walls to create the EMITBI enclosure and (b) any required AHU units to cool the added IT modules. With the above expansion process, the expanded EMITBI 1410 includes a second base pad placed adjacent to the expansion connecting edge of the initial base pad. The second base pad abuts the expansion connecting edge to provide an expanded usable space for placement of additional IT modules. The initial base pad and second base pad are constructed to allow the second base pad to be horizontally flushed with the base pad and constructed in place directly adjacent to the initial base pad without affecting the REW. In this way, the REW 150 remains in place during construction of the second base pad, such that the expansion of the EMITBI into an expanded EMITBI 1410 occurs without affecting operation of existing IT gear within the initial enclosed section of the original EMITBI. Accordingly, the extended usable space increases the capacity of the EMITBI to hold additional IT modules and increase a computational size of the LMIHS 105.

FIG. 15(A-B) is a flow chart illustrating a method 1500 for modularly expanding a usable space of an EMITBI during operation of existing IT modules in a baseline EMITBI, according to one or more embodiments. Additionally, FIG. 15 provides a method 1500 for constructing and physically expanding an EMITBI to provide additional usable space to accommodate additional IT modules without disrupting functional operation of the existing LMIHS located within an original enclosure of the baseline EMITBI. Method 1500 involves the various processes involved in the expansion of the EMITBI as illustrated by FIGS. 9-14 (and also within the following FIGS. 16-23), and summarized by FIG. 23, described below. Method 1500 is described with general reference to FIG. 23, and as needed with specific reference to FIGS. 9-14. FIG. 23 provides an illustration summary of the structural changes that are implemented from a baseline EMITBI on an initial start date of the expansion process to the expanded EMITBI at a completion date of the expansion process, according to the illustrative embodiments presented herein.

Referring to FIG. 15 and beginning at block 1502, method 1500 includes constructing an initial segment of the EMITBI having a first base pad, a plurality of exterior walls connected at adjacent ends to create an initial enclosure around the first base pad, and a roof structure placed on top of the initial enclosure. At least one of the plurality of exterior walls is a removable expansion wall (REW), which has a plurality of structural connection mechanisms that allow for later de-assembly and removal of the REW without affecting a structural integrity of a remainder of the EMITBI. As a part of this construction of the baseline EMITBI, method 1500 can include attaching one or more AHUs to support cooling of later inserted IT gear (block 1504). Method 1500 also includes providing a PSD system 130 that is configured to provide full power for the IT gear (and optionally the AHUs, in one embodiment) (block 1506). Method 1500 further includes providing, within the EMITBI, a plurality of modular components that house one or more racks of IT gear that can collectively operate as a LMIHS (block 1508). Method 1500 then includes, when expansion of the EMITBI computing capability/capacity/size is desired, determining (at decision block 1510) if the baseline EMITBI is at full capacity, and adding the additional modules for the IT gear within the EMITBI when space exists within the EMITI for further expansion (block 1512).

However, when there is no additional space within the baseline EMITBI to support the required/desired expansion, method 1500 moves to blocks 1514-1530 (FIG. 15A-15B), which provides processes involved in enabling expansion of the EMITBI to accommodate a need for additional capacity to house additional modular components beyond a maximum number of modular components that can be housed within the initial enclosure. Specifically, method 1500 includes: constructing a second base pad abutting a connecting end of the first base pad at which the REW is attached to a first segment of the EMITBI (block 1514); constructing or installing flooring on the base pad as usable space for the new modules (block 1516); constructing and affixing side exterior walls to abut, connect to, and extend from the initial side exterior walls along the sides of the second base pad (block 1517); constructing an end wall opposed to the REW (block 1518), where the end wall, two side walls and REW provide a second enclosure; constructing an extension of the roof structure or a second roof structure over the second enclosure (block 1519). According to one aspect of the method, the initial base pad has a first area to accommodate a maximum number of a first set of modular IT components, and the second base pad has a second area that supports accommodation of a second number of modular IT components, such that the expanded EMITBI houses greater than the maximum number of modular IT components. Further, in one embodiment, method 1500 includes constructing the end wall of the second segment as a REW to allow for further expansion of the EMITBI.

Figure 16:
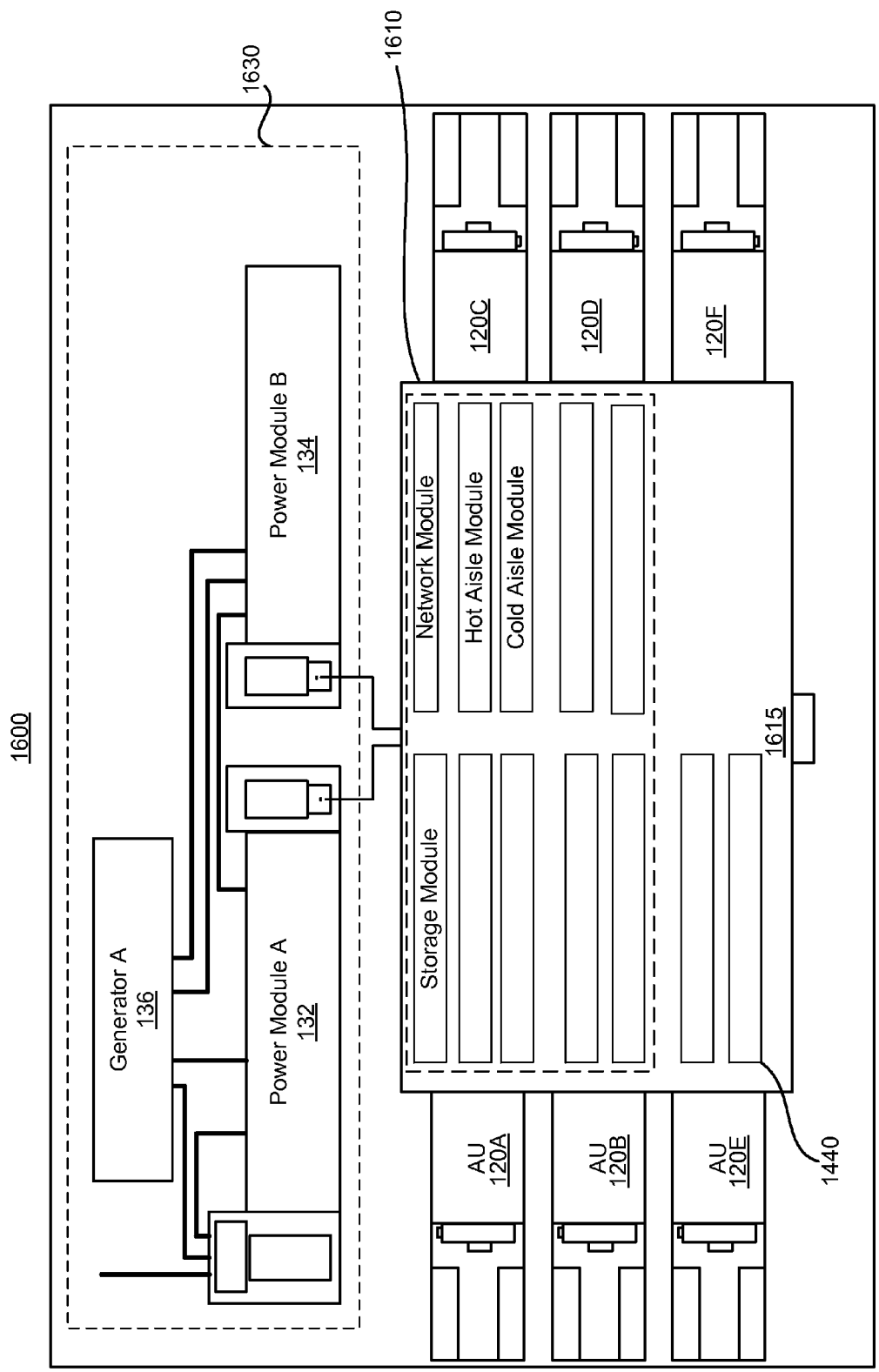
FIG. 16 is a block diagram illustrating the addition of an AHU in advance of IT components to support modular enhancement/expansion of the cooling system of the EMITF as additional IT gear is added within the EMITBI and/or the EMITBI is expanded, according to one or more embodiments.

As described in greater details with respect to FIGS. 16-22, and specifically illustrated by FIG. 16, method 1500 also includes, attaching an AHU to be in fluid communication with the selected section of the expanded usable space (block 1520). Method 1500 also includes installing the new modular components with IT gear at the specific section of the additional usable space (block 1522). Method 1500 next includes adding or extending the power distribution lines to provide power for the newly added IT gear (block 1524).

When construction of the second segment of the EMITBI is completed and all installations are completed, such that the IT gear is in place and ready to be powered on (as determined at decision block 1526), method 1500 includes de-assembling and removing the REW to allow the second segment and first segment to be combined into an expanded EMITBI having a greater contiguous usable interior space (block 1528). The new IT gear can then be powered on and configured as added IT components within the LMIHS (block 1530). Accordingly, the REW remains in place during construction of the second segment to continually protect the IT components located therein, such that the expansion of the EMITBI occurs without affecting the operation of the existing LMIHS within the initial enclosure of the baseline EMITBI.

Thus, the EMITBI provides a scaled approach to add devices and redundancy while physically expanding a data center footprint using pre-fabricated modules for cooling, power, and usable space for placement of the functional IT modules. The EMITBI comprises dedicated hot and cold aisle modules that are placed on the usable space, and, in one embodiment, the REW is located at a cold aisle module and the new external wall is also provided at an opposing cold aisle module to allow for later expansion.

Accordingly, the disclosure provides large compute pads within building structures that provide interior usable space for IT racks. As additional aspects of the disclosure, the base pad provides an interior usable space for IT racks and the building structures include one or more exterior walls that are specifically designed and/or constructed to enable modular expansion of the building structure by extending the build pad, constructing a second external wall, installing the additional IT gear in the extended usable space, and then removing the previous exterior wall to create a larger overall compute system in a single continuous (and contiguous) accessible space without disrupting the original IT gear, which remains operational during the expansion process. According to one aspect, the external wall (REW) is constructed at the cold aisle of the initial space. Further, according to one embodiment, the REW can be made of a lightweight composite fiber, metal panel with fiberglass insulation, a structural foam panel, or some other lightweight, structurally durable material. Materials utilized to fabricate the REW can vary depending on implementation and design. Also, in one embodiment, the REW is designed with sound proofing considerations, and considerations for providing mounting surfaces for sensors. The soundproofing reduces the amount of noise that enters the EMITBI while the construction activities are occurring on the outside of the initial baseline EMITBI behind the REW.

As introduced above and illustrated in the preceding figures, EMITF 100 includes a plurality of AHUs 120 and associated Chiller Units. According to one aspect of the disclosure, the design of the side walls of the EMITBI 110 includes AHU bays 122, which support and/or enable addition of an AHU for each added pairing of hot and cold aisle modules. This design of EMITBI 110 allows for the scaling of cooling as required to support the later addition of IT gear to an existing hot aisle module without requiring another AHU be deployed for the EMITF 100. The scaling then occurs when an entire new hot aisle module of IT gear is added to the EMITBI 110.

The EMITBI 110 includes multiple sections/rows aligned adjacent to the AHU bays 122, each section having a specific number of modular components that require cooling. The corresponding AHU bay 122 is defined within the interior space adjacent to the exterior wall of the corresponding section, such that each of the at least one AHU interfaces with a corresponding AHU bay to be in fluid communication with the modular components located within the corresponding section of the EMITBI 110. The AHU thus provides cooling to the IT gear hosted by the modular components located within the corresponding section of the EMITBI 110.

In the majority of the figures, example AHU 120 is designed for placement on the ground, outside of EMITBI 110, and to be in fluid communication with modules placed in one (adjacent) portion or section of the assembled EMITBI 110, in accordance with one embodiment. In alternate embodiments, the AHU 120 can be located on or above the ceiling or roof structure of the EMITBI 110. This alternate embodiment is particularly useful when there is a limited amount of real estate on which to construct the EMITF 100. This alternate embodiment can also allow for possible expansion of the EMITBI 110 at the sides of the EMITBI 110 (with at least one of the side walls configured as a removable expansion wall) utilizing the location of the currently shown AHUs 120 within the preceding figures as expanded usable space. As illustrated by the various preceding figures, each AHU 120 provides cooling air flow for the functional and/or functioning IT gear that is located within the modular components placed adjacent to the AHU on the interior of the EMITBI 110. Specifically, as shown by the illustrative embodiments, each AHU 120 is assigned to a paired combination of a cold aisle module 410 and a hot aisle module 420. As also provided by the later figures, a new AHU 120 is provided whenever a new cold aisle module 410 containing heat generating IT components that require cooling is introduced or about to be introduced to the EMITBI.

According to a more specific aspect of the present disclosure, the EMITBI 110 includes at least one air handling unit (AHU) 120 in fluid communication with the enclosure to support cooling of the IT gear housed in one or more modules within the EMITBI enclosure. In one embodiment, in which the EMITBI 110 is an expanded EMITBI (i.e., expanded from a baseline EMITBI via removal of the REW), the at least one AHU 120 includes a first (set of) AHU 120 in fluid communication with a first segment of the expanded EMITBI 110 to provide cooling to the IT gear located within the first segment of the expanded EMITBI 110. A second AHU 120 (or set of AHUs) is then provided to cool the additional IT gear located within the second segment of the expanded EMITBI 110. According to one aspect, the first and second (sets of) AHUs 120 can be connected to a single primary temperature control that can separately control each AHU to cool specific areas of the expanded EMITBI enclosure independent of other areas of the expanded EMITBI enclosure.

As one aspect of the disclosure, modular expansion of the cooling system of the EMITBI 110 occurs concurrently with the expansion of the IT capabilities of the EMITBI and/or LMIHS 105. The EMITF 100 includes: an EMITBI 110 having a usable space with one or more external walls configured with a plurality of AHU bays 122 that are positioned along a perimeter of the usable space. The external walls can be external side walls. The EMITF 100 also includes: a plurality of modular components placed within the EMITBI 110 on the usable space 115 and operational as the LMIHS. At least one of the plurality of modular components include IT gear that dissipates heat and requires cooling. Further, the EMITF 100 includes at least one air handling unit (AHU) 120 in fluid communication with the EMITBI 110 enclosure via a corresponding AHU bay 122 to support cooling of one or more of the IT components within the enclosure. The EMITBI 110 provides a protective enclosure (with a controlled environment) within which the LMIHS 105 can operate with minimal direct exposure to an environment outside of the plurality of exterior walls.

Referring again to the example illustration of FIG. 13, when the EMITBI is an expanded EMITBI 1310, the AHUs 120 include a plurality of AHUs, including initial AHUs in fluid communication with the initial assembly of the baseline EMITBI 110 and added AHUs in fluid communication with the expanded section (1305) of the expanded EMITBI. Accordingly, a first set of AHUs 120 is in fluid communication with the first baseline section (105) of an expanded EMITBI 1310 and at least one second AHU is in fluid communication with a second later-added section of the expanded EMITBI 1310. The second AHU 120 provides cooling for additional IT gear placed within modular components placed within the added section of the expanded EMITBI 1310.

According to one embodiment, the first set and second set of AHUs 120 can be connected to a system-level cooling controller that can separately control an amount of cooling provided by each AHU to cool the corresponding sections of the expanded EMITBI 1310. This cooling can be independent of the amount of cooling provided by other AHUs 120 to cool other sections of the expanded EMITBI 1310. The controller can receive temperature readings from the different sections/areas within the EMITBI and provide facility level balancing of temperature within the EMITBI utilizing the different AHUs 120.

According to one alternate embodiment, the AHUs are located on top of the EMITBI to reduce a footprint of the EMITF 100 relative to usable ground space. In this alternate embodiment, addition of AHUs 120 can occur either outside of the newly constructed physical support side walls or atop the roof structure so that further expansion of the usable space is not limited to a single directional expansion based on a physical location of the AHUs on the ground, outside of existing side walls of the EMITBI 110. Thus expansion can occur in full-row sizes of IT modules (or racks), supported by a single AHU 120 that is designed to sit atop the roof structure of the EMITBI 110. These modular IT components can thus be shipped as complete units to an end customer and utilized to build and/or expand an existing LMIHS 105. The AHUs 120 are themselves shipped as units and then assembled on top of the EMITBI 110.

Figure 17:
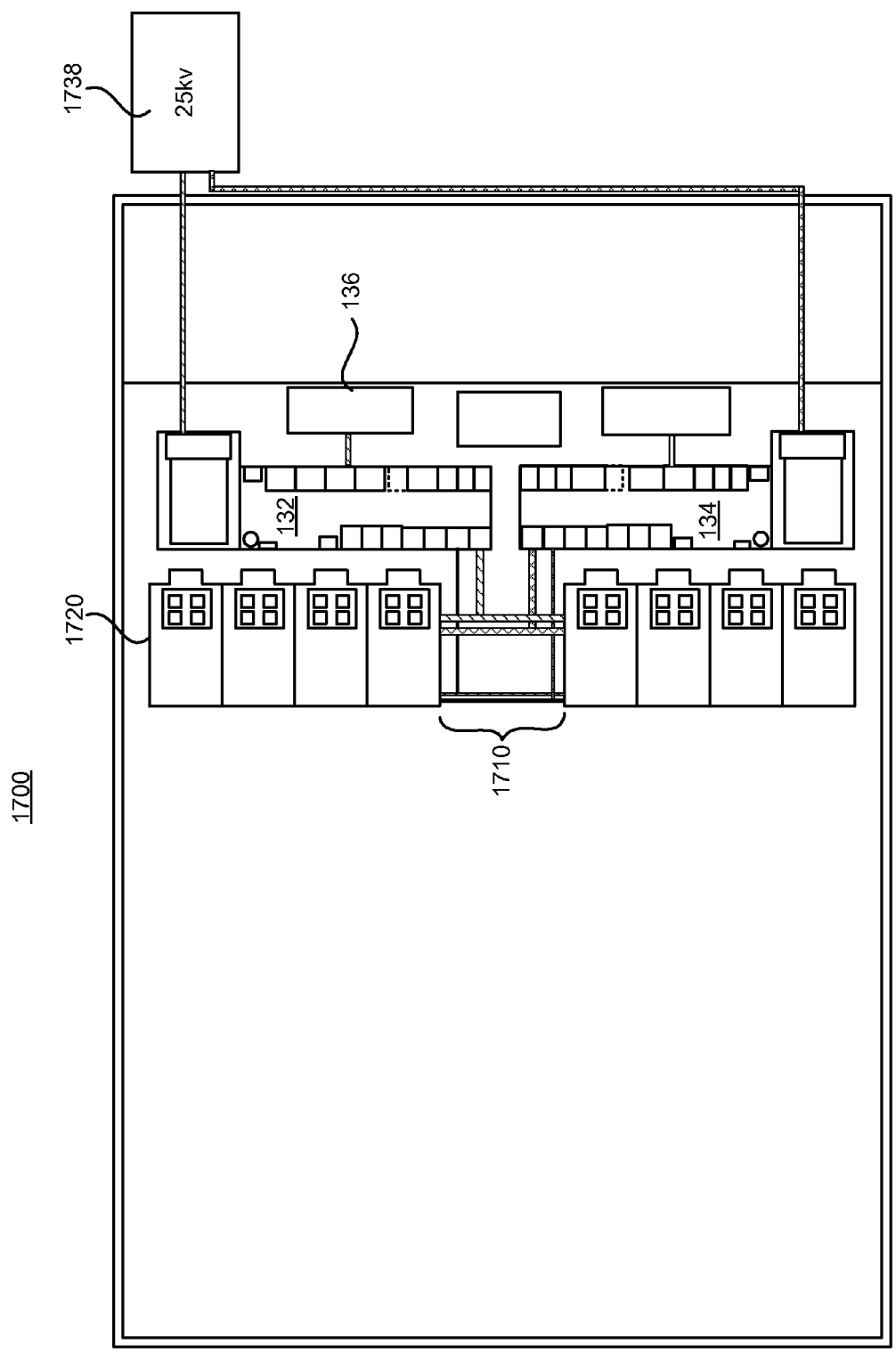
FIGS. 17-18 provide two depictions of an alternate embodiment of the EMITBI with the AHUs position on top of the modular components to allow for direct scaling of the EMITBI without requiring additional ground space for the large number of AHUs required as the EMITBI grows, according to an alternate embodiment.
Figure 18:
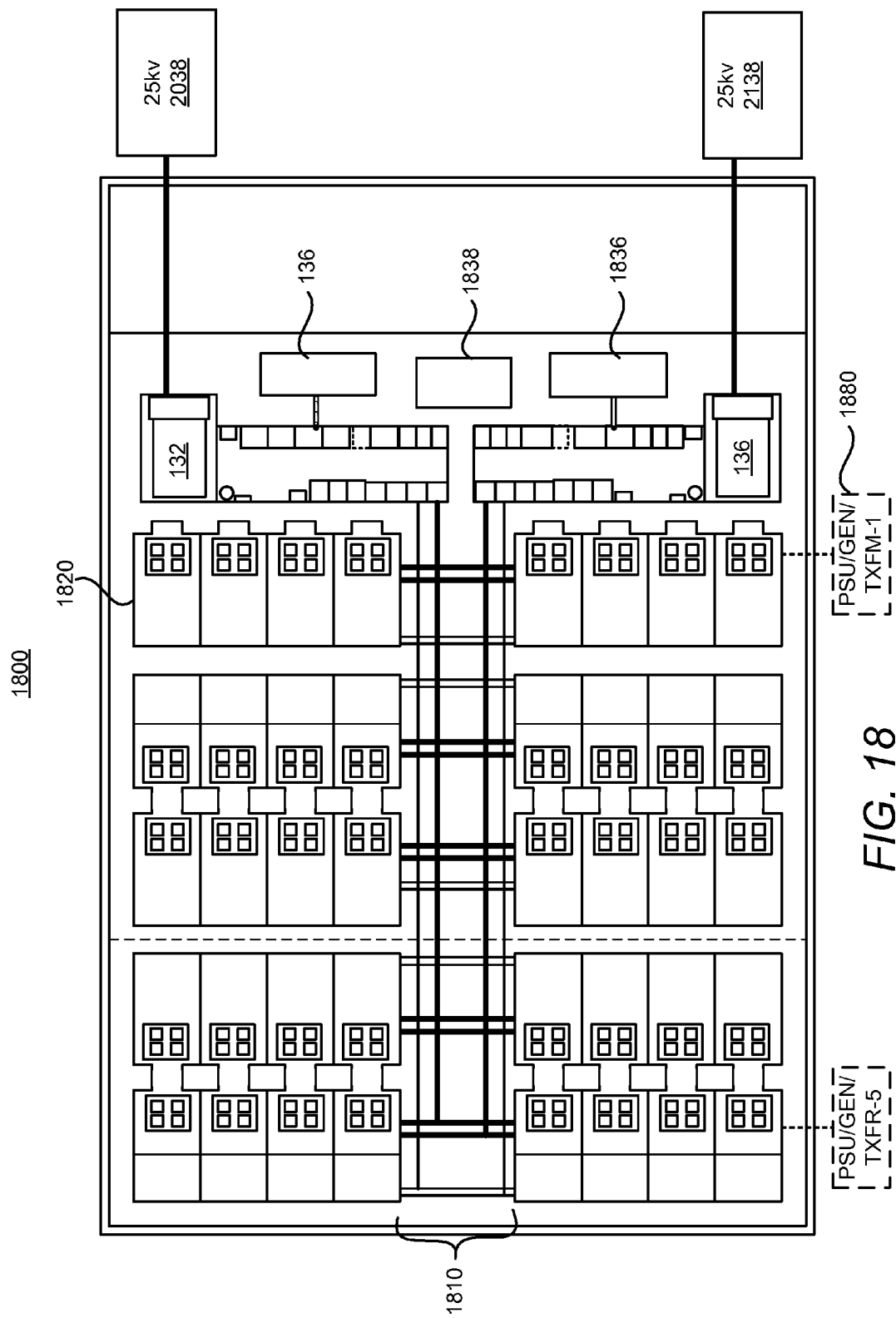

Examples of the expansion with this alternate embodiment are illustrated by FIGS. 17-18. As shown, the AHUs 120 are located on top of the EMITBI 110 to reduce a footprint of the EMITBI relative to usable ground space. This enables future expansion along one or both of the sides of the EMITBI, without having to relocate AHUs 120 during such expansions. The underlying concepts related to the expansion of the baseline EMITBI 110 apply, regardless of the location of AHUs 120 relative to the internal modular components of the EMITBI 110. That is, regardless of the location of the AHU 120 relative to the EMITBI 110, the system cooling can be modularly expanded by simply adding a new AHU as needed to support expansion of the EMITBI and/or modular components having additional IT gear. With the illustrative embodiments, an additional AHU 120 is required to be assigned to each newly added cold aisle module 410 containing functioning IT gear in order to support the cooling required once the newly added IT gear becomes operational.

In the illustrative embodiments, the AHUs 120 are placed on the outside of the exterior side wall adjacent to the modular component containing IT gear that the AHU is being utilized to cool. Further, the AHU 120 is placed in fluid communication with the interior segment prior to functionally operating the IT component within the enclosure. The AHUs 120 are added as needed when expansion of the EMITBI 110 occurs.

Figure 19:
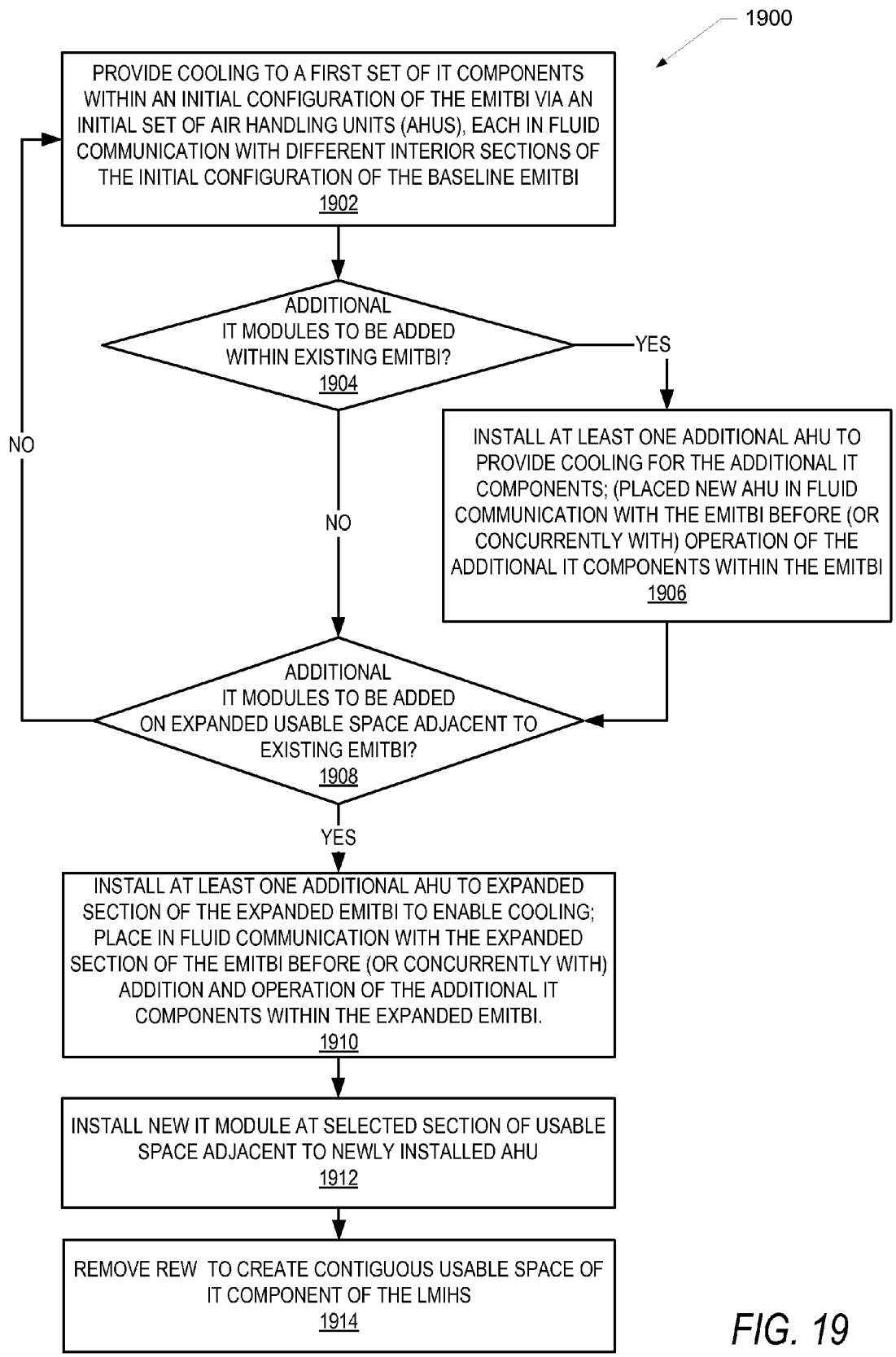
FIG. 19 is a flow chart illustrating the method by which the cooling system of the EMITF is modularly expanded to include additional AHUs as additional IT gear is added within the EMITBI and/or the EMITBI is expanded, according to one or more embodiments.

FIG. 19 is a flow chart that generally provides a method 1900 for cooling IT gear located within an interior of an expanded EMITBI. The method includes: cooling a first set of IT components within an initial configuration of the EMITBI via an initial set of AHUs, each in fluid communication with different interior sections of the baseline EMITBI (block 1902); when additional IT components are to be added within the EMITBI (as determined at decision block 1904), installing at least one additional AHU to provide cooling for the additional IT components (block 1906). According to one embodiment, the additional AHU unit is installed and placed in fluid communication with the EMITBI before operation of the additional IT components within the EMITBI. Method 1900 further includes: when an expansion of the EMITBI is being undertaken via expansion of the usable space and surrounding exterior walls (as determined at decision block 1908), installing at least one additional AHU to an expanded section of the expanded EMITBI to enable cooling for any additional IT components placed within the expanded usable space (block 1910). The additional AHU unit is installed and placed in fluid communication with the expanded section of the EMITBI before addition and operation of the additional IT components within the expanded EMITBI (1910). It is appreciated that the timing of the installation of the cold aisle modules 410 after the installation of the AHU 120 is a strategy employed to ensure that the electronic components are placed within the correct cooling environment without damage to the components. The AHU is turned on along with the requisite sensors in and around the location of the later-added IT gear to ensure a proper temperature is maintained for the IT gear's storage and/or operation.

As one aspect of the disclosure, the additional AHU is installed prior to removal of a removable exterior wall (REW) separating the initial usable space from the expanded usable space during the expansion (block 1912). Once the AHU and IT components are installed within the expanded usable space, the REW is removed to create a contiguous expanded usable space with IT components of the LMIHS (block 1914).

Figure 20A:
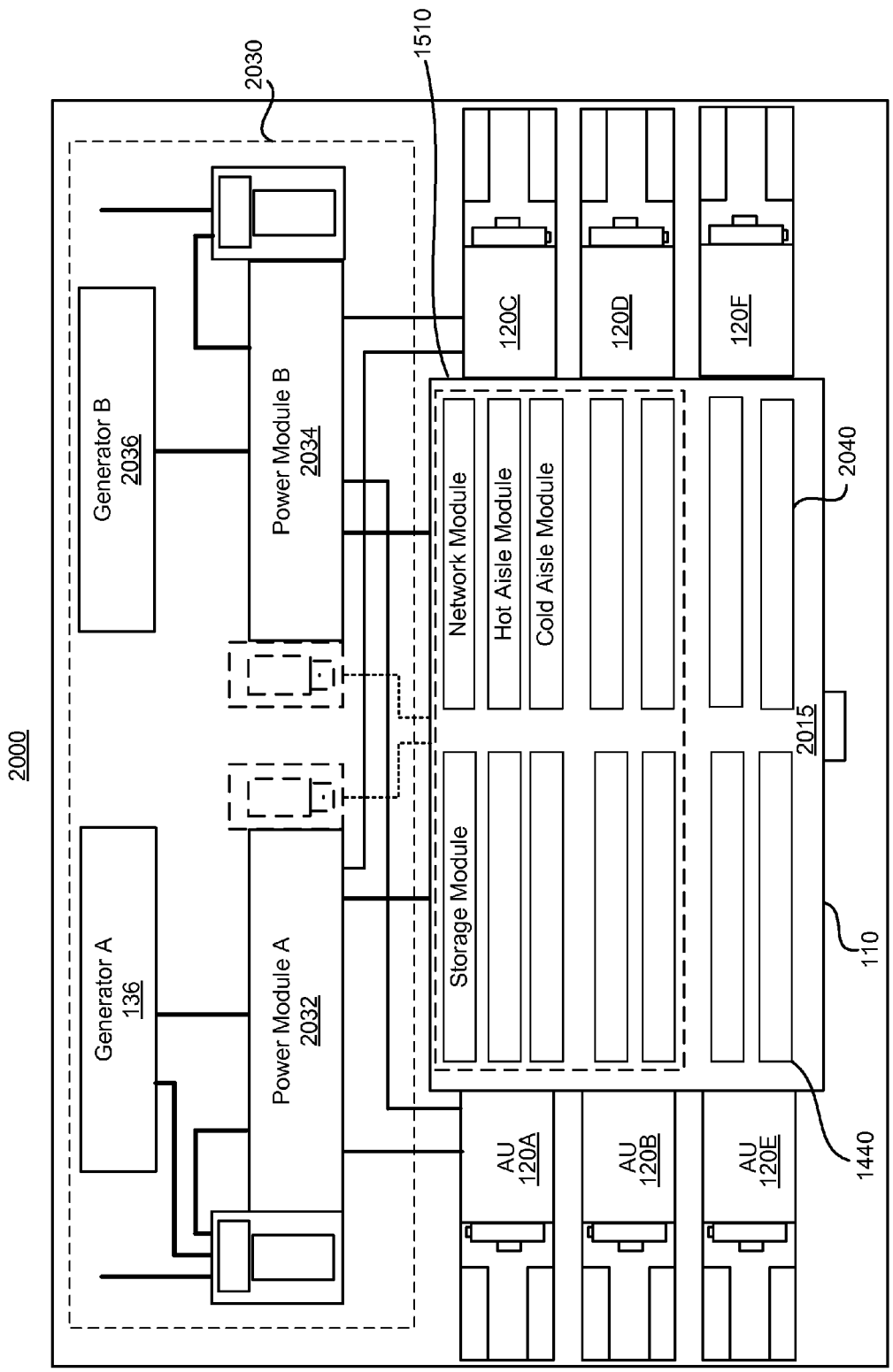
FIGS. 20A-20B respectively provide a block diagram and a three dimensional view depicting the addition of a power generator to increase a capacity of the power subsystem of the EMITBI to support the expected increase in overall system power requirements of the expanded EMITBI, in preparation for further expansion of the IT capacity of the Expanded EMITBI within the expanded usable space, according to one or more embodiments.
Figure 20B:
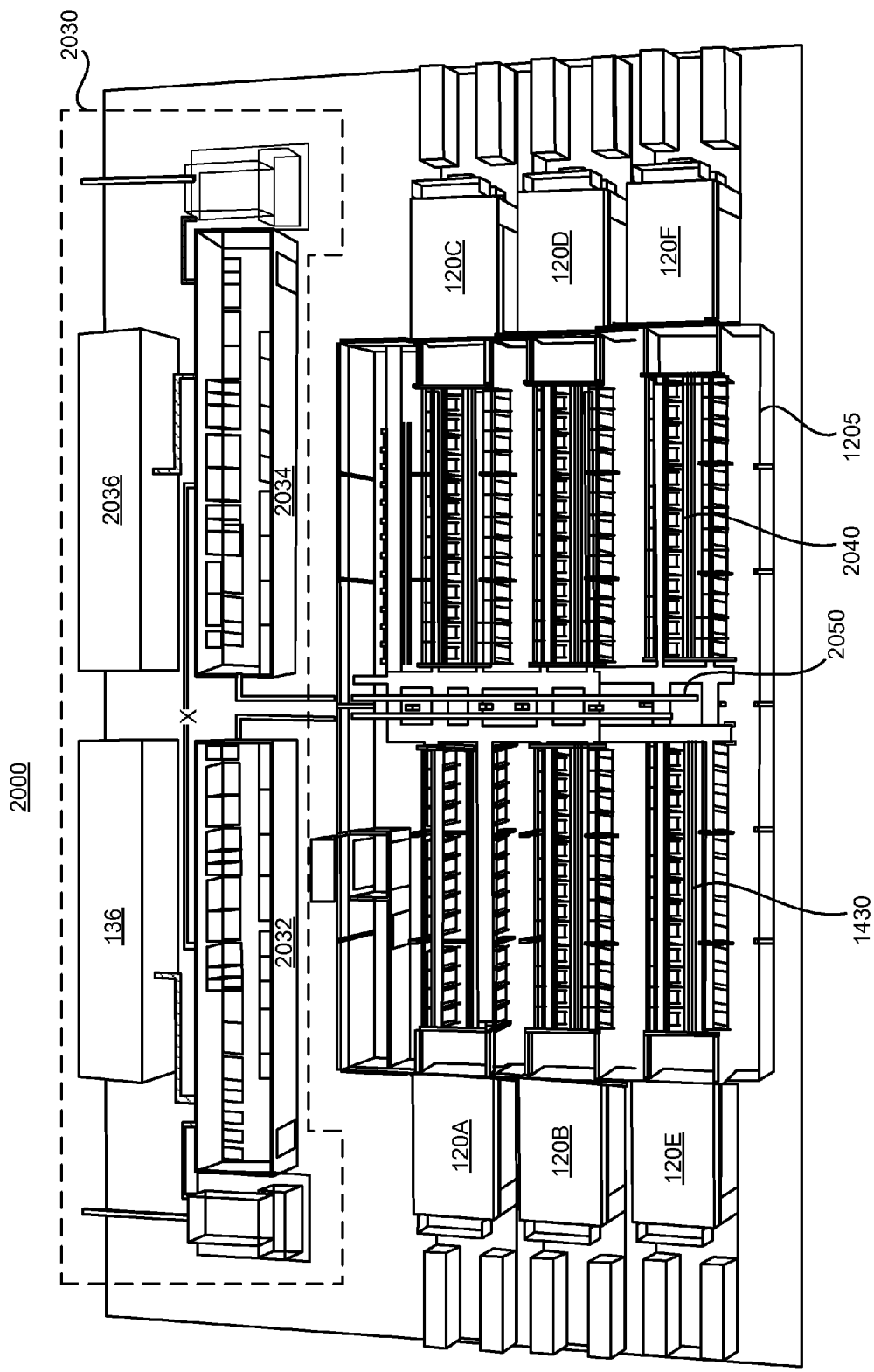
Figure 21:
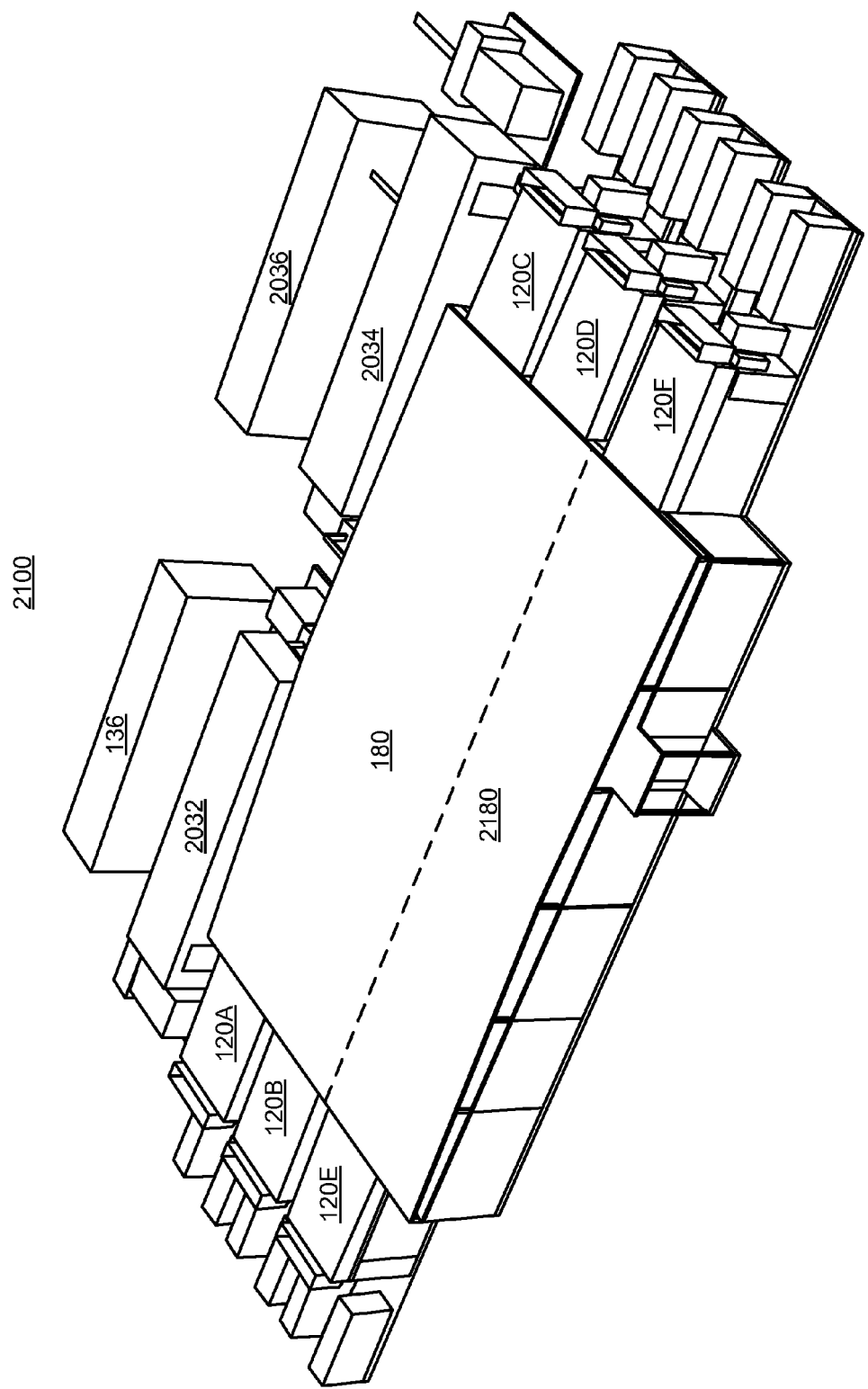
FIG. 21 depicts a three dimensional structure that incorporates and/or results from the modular expansions of the usable space, IT gear, AHUs, and power generators, complete with an expanded roof structure and an installed second REW to allow for further usable space expansion, according to one or more embodiments.

FIGS. 20A-20B and 21 depict the modular expansion of the power generation capabilities of the EMITF 100. Specifically, FIGS. 20A and 20B respectively provide a block diagram and a three dimensional diagram depicting the addition of a second power generator to increase a capacity of the power subsystem 2030 of the EMITF 2000 to support the increased overall system power requirements of the expanded EMITBI 2010, and in preparation for further expansion of the IT capacity of the expanded EMITBI within the expanded usable space 2015, according to one or more embodiments. FIGS. 20A-20B also illustrate the component makeup following the addition of another AHU 120F followed by installation of a pair of cold aisle module and hot aisle module within the expanded usable space. With this addition of modular components 2040, the expanded EMITBI 2010 is at full capacity. However, as one important aspect of this further expansion, the power requirements for the larger numbers of IT gear operating within the expanded EMITBI 2010 also increases and reaches or approaches capacity of the single generator implementation. This condition is detected by a controller within the baseline power subsystem 130 and triggers a notification that is outputted to IT or facility personnel that an increase in the amount of available power is required. Further, based on a pre-configuration of the power subsystem 130, this additional power can be efficiently achieved by addition of a second power generator or an external power supply. As a design aspect of the EMITF 100, the baseline power subsystem 130 is configured to be able to seamlessly support the addition of an additional power generating facility that can then be connected to the existing power supply and/or power distribution system 2038. Thus, as shown, expanded EMITF 2000 includes a second power generator 2036 that is tied into the electrical power distribution system 2038 of the EMITF 2000. This ability to simply attach a second power generator 2036 to support increased power needs of the expanding EMITBI 110 is described in greater detail in one or more paragraphs below. With the expansion, PSD system 2030 now includes first power generator 136, second power generator 2036 and associated reconfigured power supply units 2032 and 2034, which are now respectively attached to one of the two power generators. Notably, the addition of an entire power generator further supports even further expansion of the IT capacity of the expanded EMITBI 2010 with any remaining expanded usable space or later-added usable space. This further expansion stems from the fact that adding a power generator to increase a capacity of the power subsystem of the EMITBI supports the increased overall system power requirements of the expanded EMITBI beyond the addition of the single cold aisle module that causes the power usage to approach the threshold power for the single (original) power generator 136.

Notably, with FIG. 20A, the addition of the power generator also enables use of a backup configuration of the power modules 132, 134 to provide redundant supplies to the AHUs 120. Each AHU 120 thus receives an A and a B feed and each is configured with an integrated automatic transfer switch (ATS) in the event power failure occurs at one of the attached power modules and/or the supplying generators. With this configuration, as loss of power from a first generator does not shut down the AHU and/or the entire system as the second generator continues to supply power as needed to the IT gear and AHUs within the available power cap provided by the single generator. As also shown, power modules may be connected to the IT modules and/or the AHU via optional step down transformers (illustrated with dash lines), which are optionally provided in some embodiments to further modify the voltage and/or supply current being applied to the IT modules.

FIG. 21 depicts a three dimensional structure that incorporates and/or results from the modular expansions of the usable space, IT gear, AHUs, and power generators, complete with an expanded roof structure and an installed second REW to allow for further usable space expansion, according to one or more embodiments. Accordingly, as one aspect of the disclosure provides an Expandable Modular Information Technology (IT) Building Infrastructure (EMITBI) that includes a first baseline section and a second extended section. The first baseline section includes: a first installed base pad providing a first usable space area for placement of a first maximum number of modular IT components; a plurality of exterior vertical walls extending upwards from the first installed base pad with at least two walls oriented in a lateral direction and supporting a first originally-constructed segment of an extended roof structure; and a plurality of modular IT components that collectively provides a first installation of a LMIHS 105. The first installation is completely housed within the first baseline section. The second extended section includes: a second installed base pad providing a second usable space area for placement of additional modular IT components, the second usable space area and first usable space area collectively providing a modularly-extended usable space area; a plurality of exterior vertical walls, including a pair of exterior walls abutting respective ends of the at least two walls and respectively extending laterally away from the at least two walls along respective perimeter edges of the second installed base pad, the pair of exterior walls further supporting an extension segment of the extended roof structure 2180; and an end wall abutting the ends of the pair of exterior walls opposed from the respective ends of the at least two walls, and which, together with the remaining walls and extended roof structure, encloses the IT components within a controlled environment within which the LMIHS 105 can operate with minimal exposure to an environment outside of the plurality of exterior walls.

According to one embodiment, the end wall is a removable exterior wall (REW) which includes one or more structurally rigid modules/panels having interlocking and release mechanisms (LRMs) that are only accessible from an interior side of the enclosure when the REW 150 is physically attached to the adjacent exterior wall. The REW 150 enables further expansion of the expanded EMITBI. Also, each of the adjacent exterior walls and the base pad includes a latching mechanism at a connecting point at which the REW 150 physically connects to adjacent exterior walls and the base pad.

Also, according to one embodiment, the EMITBI further includes at least one additional modular IT component that provides a second installation of modules of the LMIHS 105. The second installation is housed within the extended portion of the usable space. Also, with the EMITBI: the at least two walls run in a substantially parallel direction along the edge of the second base pad; an initially installed REW 150 extending across the perimeter ends of the two walls and initial usable space to create a first enclosure is removed to provide a contiguous interior usable space for modular expansion of LMIHS 105 extending beneath the expanded roof structure. Thus, the second segment extends from the first segment without any intervening wall structure, which has been removed post construction of the second segment. Also, the later-installed base pad, exterior walls and extended roof enclosure directly abut the initial base pad, exterior walls and roof structure to create a continuous physical exterior structure. As previously introduced, and according to one aspect, the REW is constructed of one or more materials that provide structural rigidity when vertically extended from the base pad to the ceiling. The main structural materials are collectively durable, lightweight. The modular component parts of the REW are also re-usable either within another EMITBI or for a future-installed end wall during further expansions of the EMITBI.

FIGS. 20A-20B illustrate additional details of the power usage and distribution to the EMITBI including the design of the PSD subsystem 130 to enable later addition of another power generating component to the existing power subsystem. This addition of the power generator 2036 occurs as demands for power from the overall EMITBI increases above am established threshold during the expansion of the EMITBI. Notably the added generator is simply plugged into the power supply and is thus enabled to utilize the existing power distribution mechanisms to provide the needed additional power to the IT modules and AHUs.

This modular power expansion capability provides an EMITF that supports a LMIHS and which includes: a plurality of modular IT components placed within the EMITBI on the usable space and operational as the LMIHS, where the EMITBI provides a protective enclosure (with a controlled environment) within which the LMIHS can operate with minimal exposure to an environment outside of the plurality of exterior walls, and wherein at least one of the plurality of modular IT components dissipate heat; at least one air handling unit (AHU) in fluid communication with the enclosure to support cooling of one or more of the IT components within the enclosure; and a power subsystem electrically coupled to the EMITBI via a power distribution configuration that includes a first power generating component coupled via a power distribution scheme to the power consuming IT components of the EMITBI, where the power subsystem is pre-configured to support additional requirements for power via a power capacity on demand structure, including modular expandability of the power generating components, while maintaining resiliency.

According to one embodiment, the base PSD system 130 is designed to provide stepped power capacity increases while maintaining resiliency on operation of the installed rack IT gear. Also, the base PSD system 130 includes the required breaker/s and distribution components on initial configuration of the PSD system 130 to enable the PSD system to be expanded by utilizing portions of the additional power components needed. In the embodiment, the power generating component is a generator 136, and when additional power is required, an additional generator 2036 can be connected to the existing power system. Accordingly, the configuration of the PSD system 130 allows for expanding the IT gear to include IT gear that can consume more power (i.e., surpasses existing capacity) than is provided by an initial configuration of generators. According to one aspect, the PSD subsystem 130 further includes a controller and firmware and power usage sensors within the EMITBI that monitors an overall system power usage of the EMITBI. The power controller then generates a notification to indicate when more power is required for the overall system, to trigger an upgrade of the UPS when a particular over-threshold condition is detected or expected. As one consideration of the power requirement, the expanded EMITBI includes a plurality of AHUs, including the initial AHUs in fluid communication on initial assembly of the EMITBI and the added AHUs placed in fluid communication post expansion of the EMITBI. In some embodiments, these additional AHUs add to the determination of the power requirement for the entire EMITF.

In one embodiment, described with reference to the FIG. 18 illustration, the modularity of the power supply can be provided at the granularity of each row of IT modules and associated AHUs. Thus, a smaller capacity generator feeds a smaller capacity power module that is utilized to provide power to a first row of IT modules within the EMITBI (in the initial or base EMITBI layout). Each subsequent row of IT modules is then equipped with its own AHU placed atop the EMITBI structure and its individual generator and power module. Thus, in FIG. 18, each of the five (5) rows of IT modules can be powered by separate pairings of generators and power modules scaled to support the size of the row of IT modules to which the pairing is assigned. The methodology involved in providing the required power and required cooling capacity for each added row of IT components can involve updating the UPS (universal power supply), batteries, providing additional power modules, generator, transformer/s, etc., whether completed at a row level or on a larger system level.

According to one aspect, the use of dual power supply units (PSUs) supports the modular expansion of the LMIHS. The PSUs are configured to allow one to be taken offline, while the other PSU remains operational to power the IT components and AHUs. While offline, the power capacity of the LMIHS can be expanded by (i) adding a new generator, adding one or more transformers, attaching an additional power module to the existing or expanded system, or enhancing the PSU itself with additional power capacity (e.g., adding UPS, batteries, etc.). One or more breakers are provided within the initial configuration of the power subsystem to allow for the temporary or permanent separation of the PSU as well as the addition of a generator and/or transformers as needed. Additional breakers can then be added to the enhanced power configuration to support the future expansion of power and/or the use of the additional power source/s to provide a redundant supply of power in the event the primary power supply fails.

As also illustrated in FIG. 20A, each AHU is provided a primary and a backup supply of power from separate generator-PSU pairings, with an automatic transfer switch being utilized to toggle the AHU to use the backup power supply whenever the primary supply fails or is taken offline. This further supports the addition of the generator and transformers, etc. to the power subsystem without having to shut down the entire LMIHS and in particular the IT components. It is appreciated that alternate embodiments supporting the concurrent use of the generators to supply different IT components within EMITBI is one expected use of the modularity of the power supply. These alternate configurations may require a subset of the components be taken offline prior to enhancing the power supply of the system during expansion.

Figure 22:
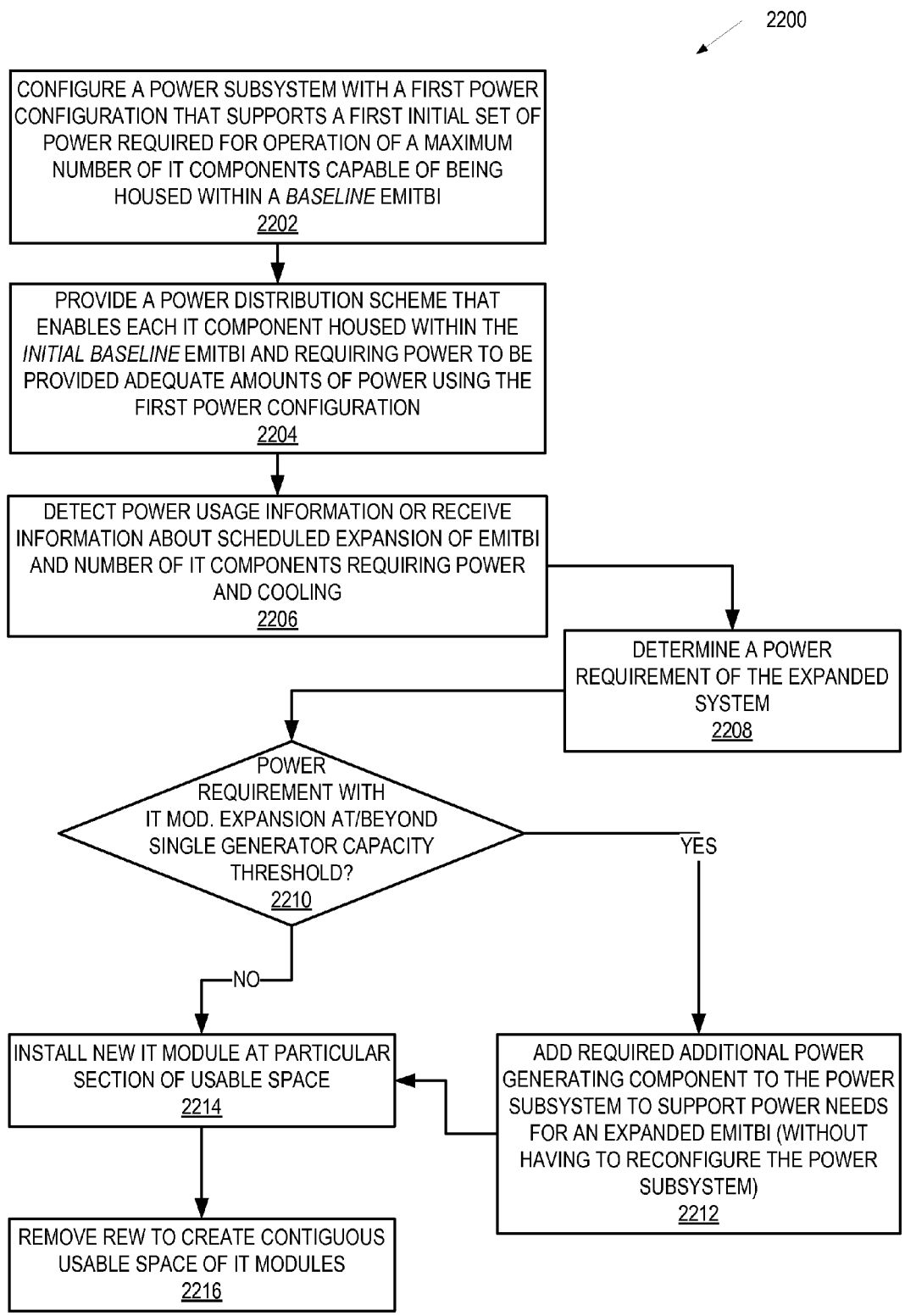
FIG. 22 is a flow chart illustrating the method by which the power supply and distribution (PSD) system of the EMITF is modularly expanded to include an additional power generator when the number of IT gear and/or associated power requirement expands beyond a threshold for the baseline power capacity of the PSD system, according to one or more embodiments.
Figure 23:
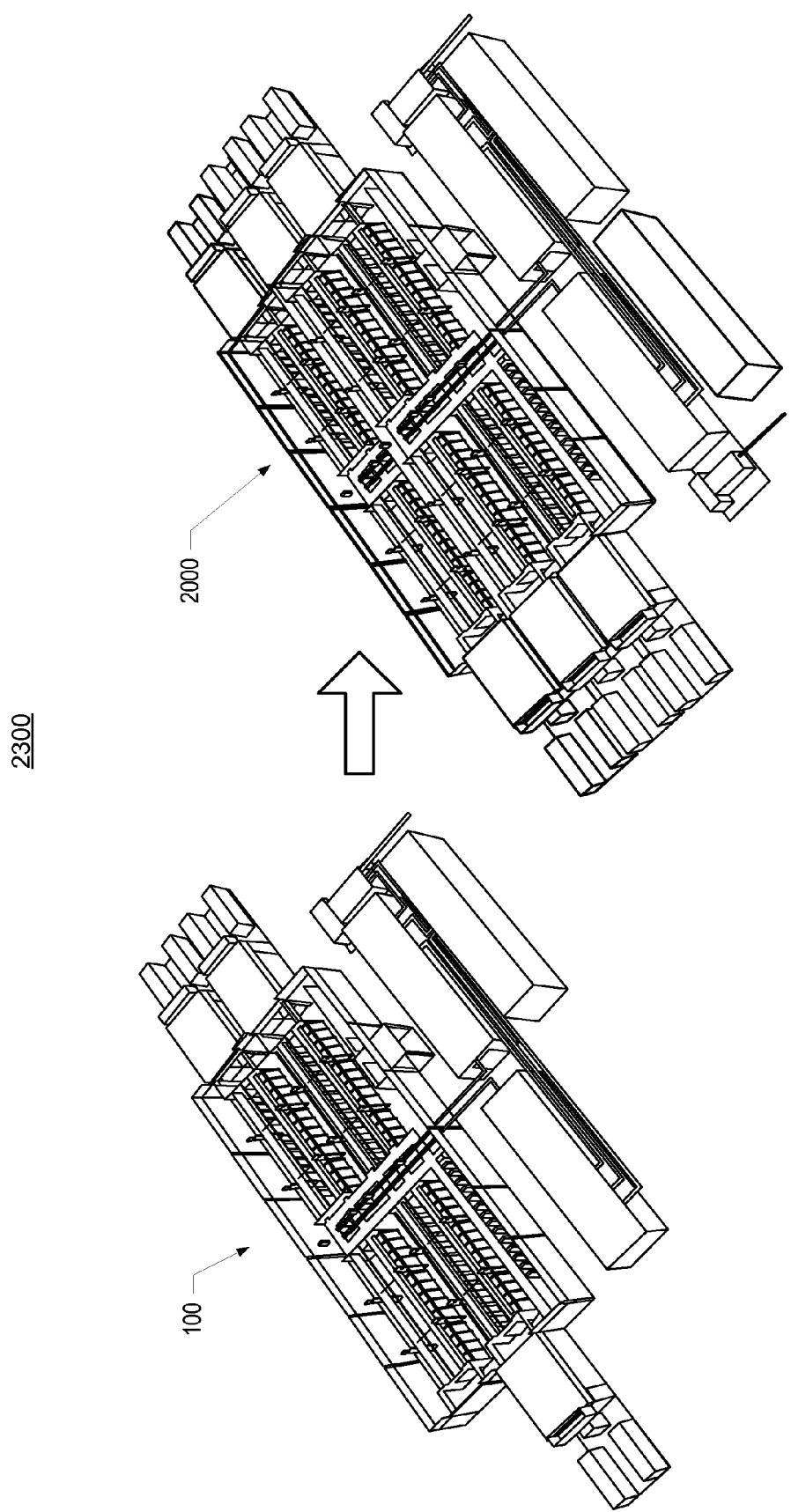
FIG. 23 provides an illustration summary of the structural changes that occur from a baseline EMITBI on an initial start date of the expansion process to the expanded EMITBI at a completion date of the expansion process, according to one embodiment.

FIG. 22 is a flow chart illustrating aspects of the method 2200 for providing expandable power capacity to IT components within an interior of an EMITBI. As shown the method includes configuring a baseline PSD subsystem with a first power configuration that supports a first initial set of power supply and distribution settings required for operation of a maximum number of IT components capable of being housed within a baseline EMITBI (block 2202). The method 2200 also includes providing a power distribution scheme that enables each IT component housed within the baseline EMITBI and requiring power to be provided adequate amounts of power using the first power configuration (block 2204). Then, when an expansion of the EMITBI is performed, method 2200 also includes: detecting or receiving the power usage information related to the scheduled expansion of the EMITBI and number of IT components requiring power and cooling (block 2206); and determining a power requirement of the expanded system (block 2208). When the power requirement reaches or surpasses a single generator capacity threshold for triggering addition of another power generating component (as determined at decision block 2210), method 2200 includes adding a required additional power generating component to the power subsystem to support power needs for the expanded EMITBI, without having to reconfigure the power subsystem (block 2212). The first power configuration includes a consideration of later addition of the second power generating component and includes the required distribution scheme to accommodate the later addition of the second power generating component, without having to re-wire the main power subsystem. This allows seamless increases in the number of IT components to be accommodated from a power perspective, without re-hauling and/or redesigning the entire power subsystem. Returning to decision block 2210, when the power requirement is below the single generator capacity threshold or following the addition of the additional power generating component, method 2200 includes installing the new IT components at the particular section of the usable space (block 2214). Then, with the power system updated and the new IT components installed, method 2200 includes removing the REW to provide a contiguous usable space of IT components (block 2216).

According to one aspect of the disclosure, the addition of the other generator involves opening certain of the interconnections that exist with the baseline power supply, including opening or removing the wired connection between both PSUs 132 and 134, opening or removing the wired connection between the first generator 136 and the second PSU 134, and other changes and or modifications to provide a single path connection between generator-PSU-IT components. Additionally, certain wired connections are made and switching mechanisms introduced to enable the second generator-PSU pairing to operate as a redundant supply with the first generator-PSU pairing when the amount of power being drawn is less than is required from a single generator. The breakers, size of wires, etc. provided within the power subsystem are all selected and installed based on the ability to modularly expand in large full-row sized IT modules.

FIG. 23, which is introduced above, provides a view of the beginning and ending times of an expansion process from the initial baseline EMITF 100 to an expanded EMITF 2000 that includes expansion of the power supply and of the cooling components required for the additional IT modules inserted within the expanded EMITBI. As shown by FIG. 23, on an initial start date of the expansion process, the EMITF 100 included PSD subsystem 130 which is powered by a single power generator 136. At or before completion of the expansion process of the EMITBI, an additional power generator 2036 is added to power subsystem 130/1530. According to one aspect of the disclosure, the EMITBI is designed with a modularly expandable PSD system that provides power capacity on demand while maintaining resiliency. The base PSD system is designed to provide stepped power capacity increases while maintaining resiliency on operation of the installed rack IT gear. The base PSD system includes the required breaker/s and distribution components that are provided during the initial configuration of the base PSD system to enable the PSD system to be later expanded by utilizing portions of the additional power components as needed. When additional power is required, such as when the expanded IT gear consume more power (i.e., surpasses existing capacity than supported by previous configuration of a single power generator), the IT personnel connects an additional/second generator to the power system. In one embodiment, a firmware monitors the power usage and generates a notification to indicate when more power is required for the overall system, triggering an upgrade of the UPS.

In the above described flow charts, one or more of the method processes may be embodied in a computer readable device containing computer readable program code such that a series of steps are performed when the computer readable program code is executed on a computing device. In some implementations, certain steps of the methods are combined, performed simultaneously or in a different order, or perhaps omitted, without deviating from the scope of the disclosure. Thus, while the method steps are described and illustrated in a particular sequence, use of a specific sequence of steps is not meant to imply any limitations on the disclosure. Changes may be made with regards to the sequence of steps without departing from the spirit or scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a GPU, or other programmable data processing apparatus to produce a machine, such that the instructions, which execute via the processor of the computer or other programmable data processing apparatus, performs the method for implementing the functions/acts specified in the flowchart and/or block diagram block or blocks.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, an electronic, magnetic, optical, electromagnetic, infrared, or semiconductor system, apparatus, or device, or any suitable combination of the foregoing. More specific examples (a non-exhaustive list) of the computer readable storage device include: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage device may be any tangible medium that stores a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An Expandable Modular Information Technology (IT) Facility (EMITF) that supports a large-scale modularly-constructed and expandable information handling system (LMIHS) comprising:
    an Expandable Modular Information Technology (IT) Building Infrastructure (EMITBI), the EMITBI having an initial enclosure comprised of: an initial base pad providing a fixed area of usable space on which one or more modular sub-components of the LMIHS can be placed; a plurality of exterior walls extending vertically from an outer perimeter of the initial base pad and connected to a roof structure, the plurality of exterior walls and roof structure collectively providing an outer perimeter of the initial enclosure of the EMITBI, within which a first maximum number of modular IT components can be housed, the plurality of exterior walls including at least one exterior wall that is constructed as a removable expansion wall (REW) that enables expansion of the usable space of the EMITBI, wherein the EMITBI protects the IT gear located therein and is expandable to an adjacent expansion space external to the REW and via later removal of the REW, without affecting the operation of the existing LMIHS within an initial enclosed segment of the EMITBI, wherein expansion of the EMITBI includes addition of an adjacent segment of base pad and constructing additional exterior side walls, ceiling and roof support structures, and a new external wall enclosing the adjacent segment of base pad, with the REW providing a first already-in place wall of the enclosed adjacent segment of base pad, and wherein the REW is physically dissembled and removed from within the expanded EMITBI after construction and preparation of the adjacent expansion space to provide a contiguous space for receiving additional modular IT components and IT gear;
    a plurality of modular IT components placed within the EMITBI on the usable space and operational as the LMIHS, wherein the EMITBI provides a protective enclosure, with a controlled environment, within which the LMIHS can operate with minimal exposure to an environment outside of the plurality of exterior walls, and wherein at least one of the plurality of modular IT components dissipate heat; and
    at least one air handling unit (AHU) in fluid communication with the initial enclosure to support cooling of one or more of the IT components within the initial enclosure.

2. The EMITF of claim 1, wherein the EMITBI includes multiple segments each having a specific number of IT components that require cooling and an AHU bay defined within the exterior wall section of the segment, such that each of the at least one AHU interfaces with a corresponding AHU bay to be in fluid communication with the corresponding segment of the EMITBI to provide cooling to the IT components located within the corresponding segment of the EMITBI.

3. The EMITF of claim 1, wherein the EMITBI is an expanded EMITBI and the at least one AHU includes a plurality of AHUs, including initial AHUs in fluid communication on initial assembly of the EMITBI and added AHUs in fluid communication post expansion of the EMITBI, wherein the expansion further includes adding at least one AHU bay to the expansion space and adding the added AHU to one of the at least one AHU bay to be in fluid communication with modular components added to adjacent to the AHU bay.

4. The EMITF of claim 1, wherein the at least one AHU comprises a first set of AHUs in fluid communication with the first segment of an expanded EMITBI corresponding to the initial enclosure and at least one second AHU in fluid communication with a second segment of the expanded EMITBI, wherein the second AHU provides cooling for additional IT components placed within the second segment of the expanded EMBRI.

5. The EMITF of claim 1, wherein the first and second AHUs are connected to a single primary temperature control that receives temperature readings from the different segments of the EMITBI within a single contiguous building infrastructure and provides facility level balancing of temperature within the EMITBI utilizing the first and second AHUs, and wherein the first and second AHUs can cool specific segments/areas of the expanded, contiguous EMITB, independent of other areas of the expanded EMITBI.

6. The EMITF of claim 1, wherein the AHUs are located on top of the EMITBI to reduce a footprint of the EMITF relative to usable ground space, wherein addition of AHUs occur with the new physical support walls or atop the roof structure so that further expansion of the usable space is not interfered with by a physical location of the AHUs.

7. The EMITF of claim 1, wherein the AHUs are placed on the outside of the exterior wall adjacent to the IT component that the AHU is being utilized to cool, and the AHU is placed in fluid communication with the interior segment prior to functionally operating the IT component within the enclosure, wherein AHUs are added as needed when expansion of the EMITBI occurs.

8. A method for cooling IT components within an interior of an EMITBI, the method comprising:
    cooling a first set of IT components within an initial configuration of the EMITBI via an initial set of air handling units (AHUs), each in fluid communication with different interior sections of the initial configuration of the EMITBI via respective AHU bays provided within the initial configuration of the EMITBI; and
    when an expansion of the IT components is to be provided within the EMITBI, installing at least one additional AHU to provide cooling for the additional IT components, wherein the additional AHU unit is installed and placed in fluid communication with the EMITBI via another AHU bay provided within the initial configuration of the EMITBI and before operation of the additional IT components within the EMITBI;
    wherein expansion of the EMITBI includes addition of an adjacent segment of base pad and constructing additional exterior side walls, ceiling and roof support structures, and a new external wall enclosing the adjacent segment of base pad, with a removable expansion wall (REW) of the initial configuration of the EMITBI providing a first, already-in place wall of the enclosed adjacent segment of base pad, and wherein the REW is physically dissembled and removed from within the expanded EMITBI after construction and preparation of the adjacent expansion space to provide a contiguous space for receiving additional modular IT components and IT gear.

9. The method of claim 8, further comprising:
    when an expansion of the EMITBI is being undertaken via adjacent expansion of the usable space and surrounding exterior walls, installing at least one additional AHU to a corresponding AHU bay within an expanded section of the expanded EMITBI to enable cooling for any additional IT components placed within the expanded usable space, wherein the additional AHU unit is installed and placed in fluid communication with the expanded section of the EMITBI before addition and operation of the additional IT components within the expanded EMITBI, and wherein the additional AHU is installed prior to disassembly and removal of a removable exterior wall (REW) separating the initial usable space from the expanded usable space during the expansion;

wherein the expansion further includes adding at least one AHU bay to the expansion space and adding the added AHU to one of the at least one AHU bay to be in fluid communication with modular components added to adjacent to the AHU bay.

* * * * *